United States Patent
Takemura et al.

(10) Patent No.: US 7,787,290 B2
(45) Date of Patent: Aug. 31, 2010

(54) SEMICONDUCTOR DEVICE

(75) Inventors: Riichiro Takemura, Tokyo (JP);
Takayuki Kawahara, Higashiyamato (JP); Kenchi Ito, Kunitachi (JP); Hiromasa Takahashi, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/545,379

(22) Filed: Aug. 21, 2009

(65) Prior Publication Data
US 2009/0310400 A1    Dec. 17, 2009

Related U.S. Application Data

(63) Continuation of application No. 11/736,088, filed on Apr. 17, 2007, now Pat. No. 7,593,253.

(30) Foreign Application Priority Data
May 18, 2006    (JP)    .............................. 2006-138428

(51) Int. Cl.
*G11C 11/00*    (2006.01)
(52) U.S. Cl. .................... 365/158; 365/203; 365/171; 365/173
(58) Field of Classification Search ................ 365/158, 365/203, 171, 205, 173, 148
See application file for complete search history.

(56) References Cited

U.S. PATENT DOCUMENTS

| | | | |
|---|---|---|---|
| 6,894,920 B2 | 5/2005 | Kim et al. | |
| 7,068,536 B2 | 6/2006 | Matsutera et al. | |
| 7,082,050 B2 * | 7/2006 | Theel | 365/158 |
| 7,085,174 B2 | 8/2006 | Hidaka | |
| 7,224,601 B2 | 5/2007 | Panchula | |
| 2002/0141231 A1 | 10/2002 | Komori | |
| 2005/0117392 A1 | 6/2005 | Hayakawa et al. | |

OTHER PUBLICATIONS

"A Novel Nonvolatile Memory With Spin Torque Transfer Magnetization Switching: Spin-RAM" by M. Hosomi, et al., IEEE 2005.

* cited by examiner

*Primary Examiner*—David Lam
(74) *Attorney, Agent, or Firm*—Mattingly & Malur, P.C.

(57) ABSTRACT

In MRAM using a spin-transfer torque switching, a sufficient writing operation with a small memory cell is realized, and a reading current is enlarged while a reading disturbance is suppressed. In the case where the free layer of the tunnel magneto-resistance element is located on the side of the bit line, using a PMOS transistor, and in the case where the fixed layer of the tunnel magneto-resistance element is located on the side of the bit line, using an NMOS transistor, an anti-parallel writing in a source grounding operation is performed. The reading and writing operation margin is improved by performing a reading operation in an anti-parallel writing direction.

5 Claims, 31 Drawing Sheets

Parallel

Anti-parallel

SEMICONDUCTOR DEVICE

CROSS-REFERENCE TO RELATED APPLICATION

This application is a continuation application of U.S. Ser. No. 11/736,088, filed Apr. 17, 2007. The present application claims priority from Japanese patent application No. JP 2006-138428 filed on May 18, 2006. The entire contents of all of the above-identified applications are hereby incorporated by reference into this application.

TECHNICAL FIELD OF THE INVENTION

The present invention relates to semiconductor devices, and particularly to a control method for writing a memory cell using a change of magneto-resistance, and particularly to a magneto-resistance change-type memory in which information is written depending upon a direction of a current.

BACKGROUND OF THE INVENTION

Out of non-volatile memories, an MRAM (Magnetoresistive Random Access Memory) which uses a change of magneto-resistance has a possibility as a RAM capable of high-speed operation. A cell structure of a conventional MRAM comprises one tunnel magneto-resistance element TMR, a selective transistor MCT for reading, writing word lines WWL, bit lines BL, and source lines SL. As shown in FIG. 28, the tunnel magneto-resistance element TMR has at least two magnetic layers. One of the two layers is a fixed layer PL in which a direction of a spin is fixed, and the other layer is a free layer FL in which a direction of a spin has two states; a parallel state or an anti-parallel state with respect to the fixed layer. Information is memorized depending upon the spin direction of the free layer; the electric resistance of the tunnel magneto-resistance element is set to a high resistance in an anti-parallel state, and the resistance is set to a low resistance in a parallel state. In a reading operation, the degree of resistance of the tunnel magneto-resistance element TMR is read. On the other hand, in a writing operation, a current is made to flow through the writing word lines WWL and the bit lines BL, so that a synthetic magnetic field is excited at the tunnel magneto-resistance element TMR, and as a result, the spin direction of the free layer is controlled. However, the writing operation has a problem that as a shrink of the tunnel magneto-resistance element TMR is advanced, the current which flows through the writing word lines and the bit lines is increased, because the strength of the magnetic field required for writing is increased. On the other hand, an MRAM (Spin RAM) which uses a spin-transfer torque switching technology which changes the spin direction of the free layer by making the current to flow vertically through the tunnel magneto-resistance element TMR, is introduced in "2005 International Electron Device Meeting Technical Digest Papers" pp. 473-476 SpRAM (Non-Patent Document 1). As shown in FIG. 29, this writing method enables the spin direction of the free layer to be controlled with the current which flows vertically through a fixed layer, a tunnel film, and a free layer. Therefore, the current required for writing is proportional to the size of the tunnel magneto-resistance element TMR, and thereby, the writing current can be reduced along with the advance of shrink, as a result, the method is excellent in scalability.

SUMMARY OF THE INVENTION

However, even in the current spin-transfer torque switching type MRAM, a current density required for writing is $1 \times 10^6$ A/cm$^2$ to $1 \times 10^7$ A/cm$^2$. Considered with the device with 50 nm×100 nm size, a current of 50 uA is required, which is the same level as the current which can be driven with the MOS transistor having the minimum process size. As a consequence, in the case where the transistor having the minimum process size is used, a direction of a voltage applied between the source and drain of the MOS transistor is different depending on the data, therefore, in some case of voltage direction, the a substrate potential of the MOS transistor is increased and a threshold voltage is also increased, as a result, the writing current cannot be secured. Furthermore, as shown in FIG. 31, in the spin-transfer torque switching, the current used to set to an anti-parallel state is larger than the one used to set to a parallel state. Consequently, the area of the memory cell must be increased in order to secure the writing current.

Therefore, an object of the present invention is to provide a structure of a memory cell which is capable of supplying the maximum writing current with a small memory cell transistor in an MRAM which uses a magneto-resistance element and uses a spin-transfer torque switching technology for writing, and to stabilize writing and reading operations by enabling writing with a low current and making a reading current in a reading operation to be large.

Main means for solving the aforementioned problem are described below.

Firstly, in the MRAM using the spin-transfer torque switching technology, a free layer of the tunnel magneto-resistance film is connected to the drain side of the NMOS memory cell transistor as compared with a fixed layer, and the fixed layer is arranged to the side of the common wiring as compared with the free layer.

Secondly, in the case where the memory cell transistor is PMOS type, the free layer of the tunnel magneto-resistance film is connected to the side of either the drain or source of the PMOS transistor as compared with the fixed layer, and the free layer is arranged to the side of the common wiring as compared with the fixed layer.

Thirdly, a resistor which is heated with the current applied from the outside is arranged in parallel with the word lines in the vicinity of the tunnel magneto-resistance element film in order to facilitate the generation of the spin-transfer torque switching.

Fourthly, in a reading operation, a voltage is applied in a direction in which the spin direction of the free layer is set to an anti-parallel state.

It becomes possible to perform a stable reading operation.

DESCRIPTIONS OF THE PREFERRED EMBODIMENTS

Figure 1:
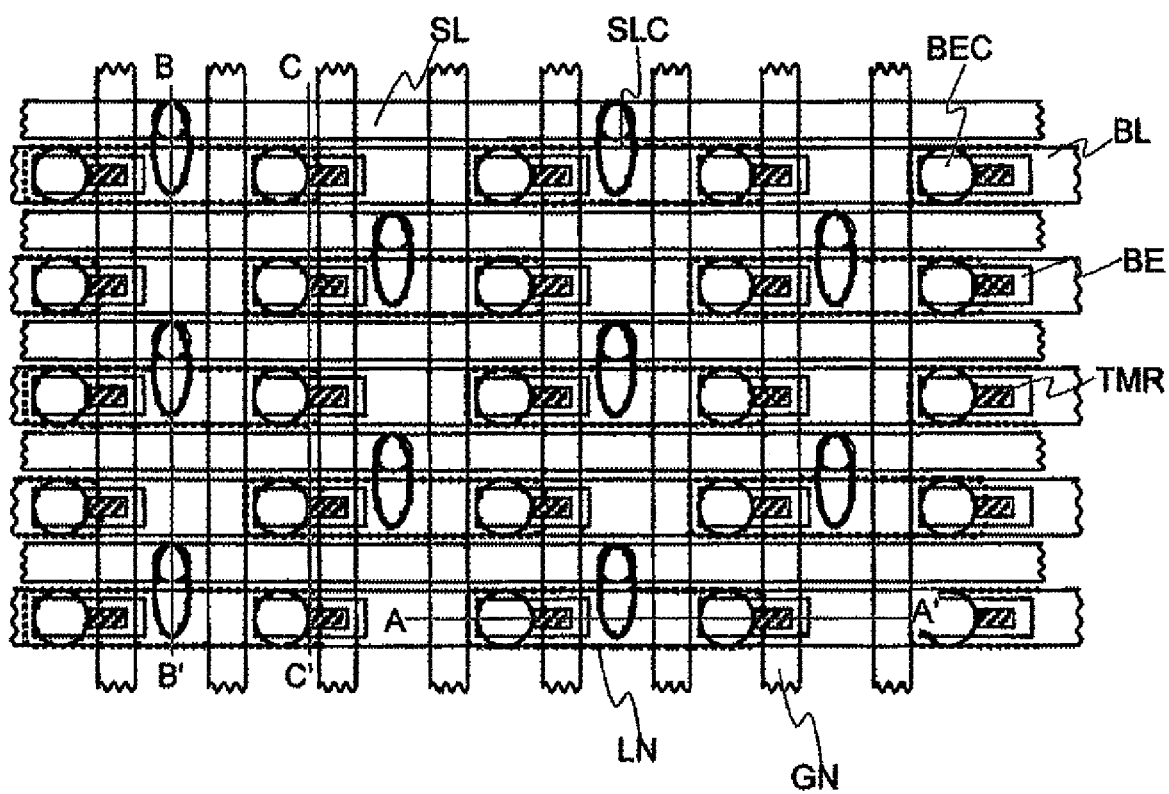
FIG. 1 is a layout view of a memory cell according to a first embodiment of the present invention.

Hereinafter, embodiments of the present invention will be explained in detail using the drawings. A circuit element which constitutes each of the function blocks of the embodiments is not particularly limited. The circuit element is formed on a semiconductor substrate of single-crystal silicon or the like with the integrated circuit technology such as the known CMOS (complementary MOS transistor). As for the circuit symbol of a MOSFET (metal oxide semiconductor field effect transistor), the symbol without an arrow denotes an N-type MOSFET (NMOS), which is distinguished from the P-type MOSFET (PMOS) denoted with the symbol with an arrow. Hereinafter, the MOSFET is referred to simply as a MOS in an abbreviated manner. Note that, the present invention is not limited only to a field effect transistor including an oxide insulator provided between the metal gate and the semiconductor layer. The present invention is applied to a circuit which uses an ordinary type of FET such as a MISFET (metal insulator semiconductor field effect transistor). Although the connection of the substrate potential of the MOS transistor is not particularly described in the drawings, as long as the potential is in the range where the MOS transistor is operated normally, the connection method thereof is not particularly limited. Furthermore, unless otherwise specified, the low level of a signal is denoted by "0" and the high level "1".

Embodiment 1

Figure 2:
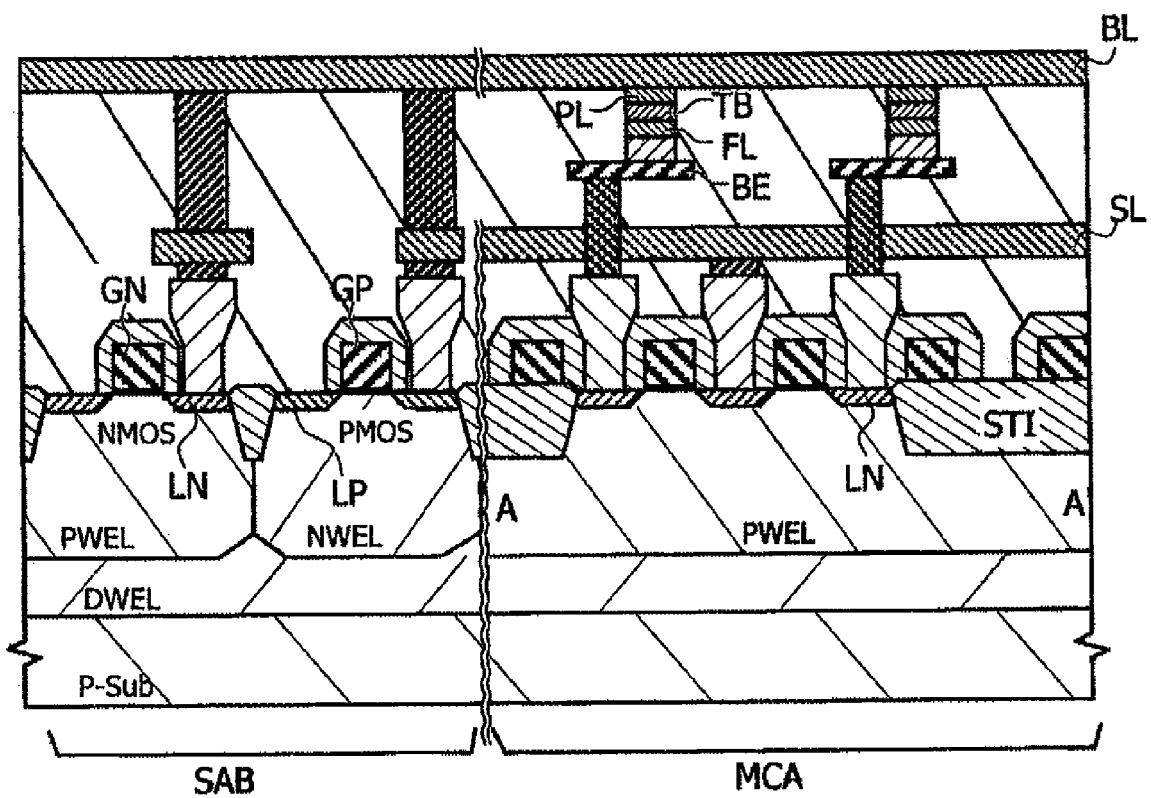
FIG. 2 is a sectional view of a memory cell and sense amplifier block according to the first embodiment.
Figure 3:
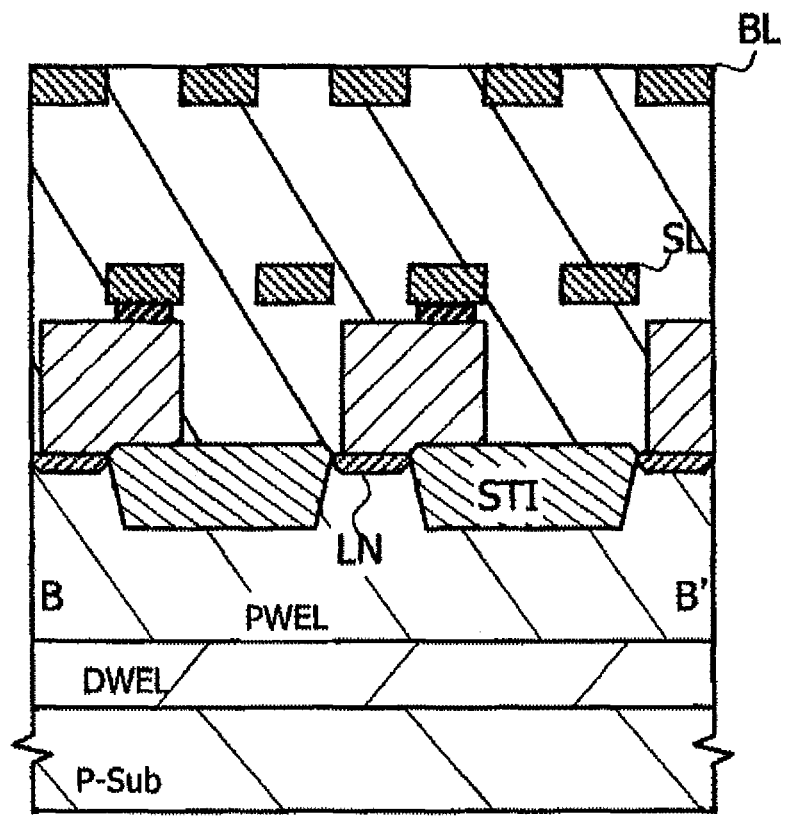
FIG. 3 is sectional views of a memory cell according to the first embodiment.
Figure 3:
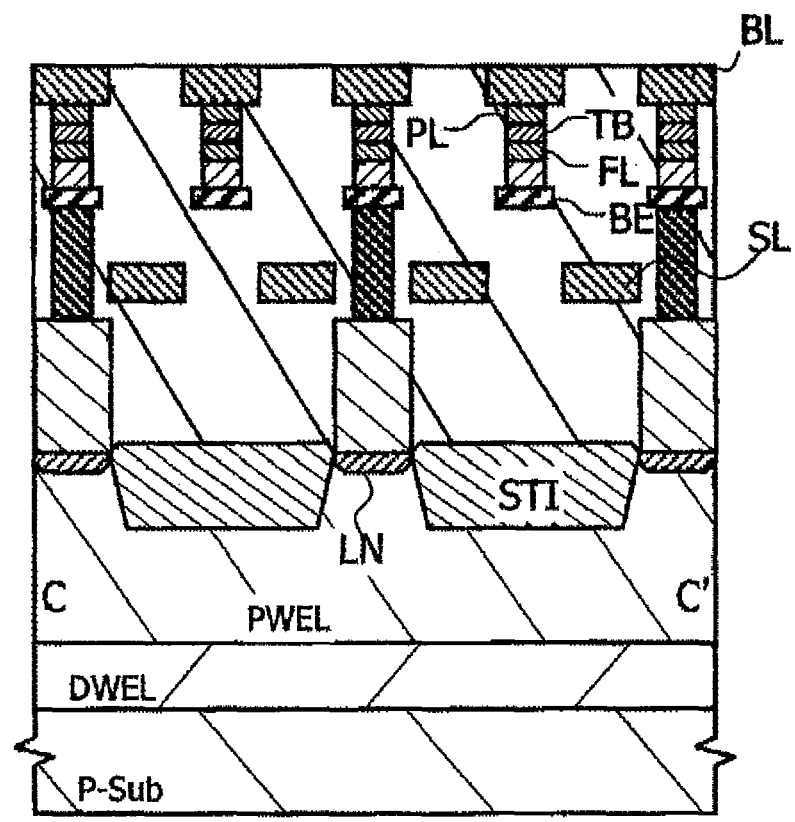

A first embodiment of the present invention will be explained. The present memory cell is composed of an N-type MOS transistor and a tunnel magneto-resistance element TMR. This structure is characterized in the arrangement of the free layer FL and the fixed layer PL of the tunnel magneto-resistance element TMR, in the case where the memory cell transistor MNT is the NMOS type, the free layer FL is arranged on the side of the transistor and the fixed layer PL is arranged on the side of the common wiring, in this case the bit lines BL. In this structure, the anti-parallel writing operation which requires a larger current compared with the parallel writing operation, can be performed by the source grounding in which the current driving power is large. Furthermore, in the reading operation a voltage is applied in the same direction as the anti-parallel writing direction to increase the reading current while preventing an error in writing. FIG. 1 is a layout view of a memory cell showing a first embodiment of the present invention. The area of the memory cell is given as $8F^2$ in the case where the wiring pitch of the word or bit lines is assumed to be 2F. FIG. 2 is a sectional view taken along the line A-A' in FIG. 1 and a sectional view of a peripheral circuit. FIG. 3 is a sectional view taken along the line B-B' and a sectional view taken along the line C-C'. The memory cell MC composed of one PMOS transistor and a tunnel magneto-resistance element TMR. The word lines WL are connected to the gate GN of the transistor. As a material of the gate, silicide or tungsten (W) is laminated on an N-type poly-silicon or an upper portion thereof to reduce the resistance. As for the memory cell transistor MNT, by constituting the P-type semiconductor area formed in the P-type semiconductor area PWEL in common structure with the NMOS in adjacent sense amplifier blocks, a separation area of the P-type semiconductor area PWEL need not to be provided, as a result, the area thereof can be reduced. Note that, the P-type semiconductor area PWEL in which the memory cell transistor MNT is formed may be separated from the NMOS in the sense amplifier. In this case, there is provided an advantage in that a substrate voltage can be independently controlled in the sense amplifier block SAB and the memory cell area. The P-type semiconductor area PWEL is formed in the N-type semiconductor area DWEL formed on the substrate P-Sub. On one side of the diffusion layer LN of the NMOS transistor, a source line contact SLC is arranged. The source line contact is shared with the adjacent memory cells MC to reduce the area thereof. On the source line contact, a source line is arranged in a direction orthogonal to the word line. On the other side of the diffusion layer NL on which no source contact is arranged, a bottom electrode contact BEC which is connected to the tunnel magneto-resistance element TMR is arranged. The bottom electrode BEC is connected to the bottom electrode BE in which the tunnel magneto-resistance element is arranged. On the bottom electrode BE, the tunnel magneto-resistance element TMR composed of a plurality of magnetic films and tunnel films are arranged not correctly above the bottom electrode contact BEC but at a position which is shifted. Because each layers comprising the tunnel magneto-resistance element TMR have thickness of order of nanometers, keeping a parallel state is important. By shifting the position of the layers from a position correctly above the contact which is difficult to be made flat, the manufacturing of the tunnel magneto-resistance element TMR becomes easy. The tunnel magneto-resistance element TMR includes at least one layer of tunnel film TB, fixed layer PL arranged on both sides of the tunnel film TB and a free layer FL. In the fixed layer PL of magnetic substance, the spin direction of the inside electrons is fixed in a certain direction. On the other hand, in the free layer FL of magnetic substance, the spin direction of the electrons takes either a parallel state or an anti-parallel state with respect to the fixed layer. In this structure, the free layer FL is arranged between the tunnel film TB and the bottom electrode, and the fixed layer PL is arranged between the bit lines BL arranged on a layer upper than the tunnel magneto-resistance element TMR and the tunnel film TB. The bit lines are wired orthogonal to the word lines and in parallel with the source lines. The tunnel magneto-resistance element TMR is formed in a rectangular or an ellipse shape in which the wiring direction of the bit lines is longer than that of the word lines. There is provided an advantage in that, by forming in a shape having a different vertical to horizontal ratio, a magnetic anisotropy, which is hardly magnetized in other directions than a parallel or anti-parallel state with respect to the fixed layer PL appears, as a result, the holding characteristic of spin direction in the free layer FL is improved.

Figure 4:
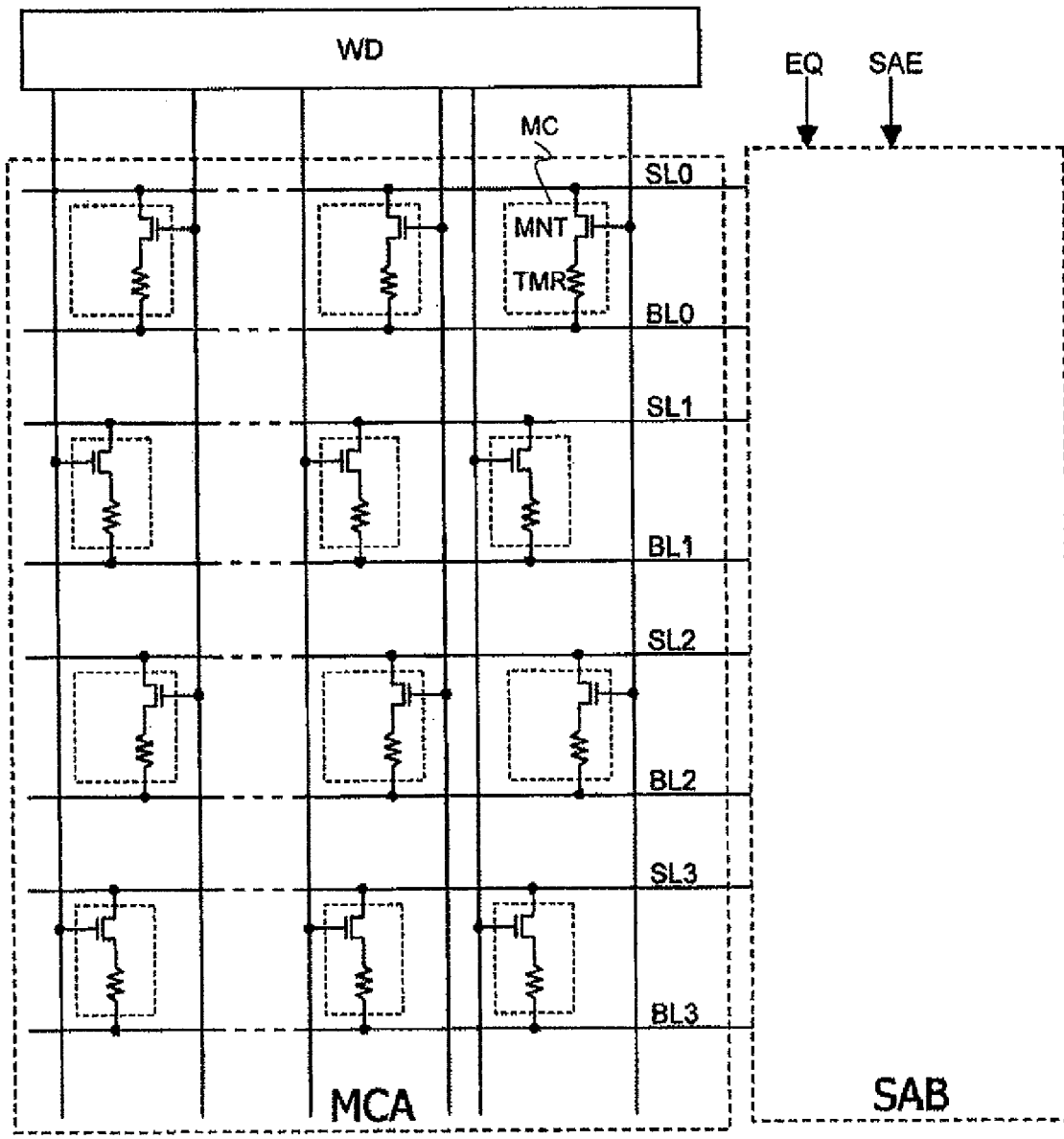
FIG. 4 is an example of a circuit diagram of a memory cell according to the first embodiment.

FIG. 4 is a layout view of this memory cell array in terms of the circuit diagram. As described above, the source lines SL and bit lines BL are wired in a direction orthogonal to the word lines WL. Although the memory cells MC are arranged on a half of the cross points of the word and bit lines, structure may be made in which the memory cells are arranged on all cross points. The bit lines BL0, BL1, BL2 and BL3 and the source lines SL0, SL1, SL2, and SL3 are connected to the sense amplifier block. The sense amplifier block includes a sense amplifier for reading a resistance state of the memory cell and a write amplifier for writing the spin state of the memory cell.

Figure 5A:
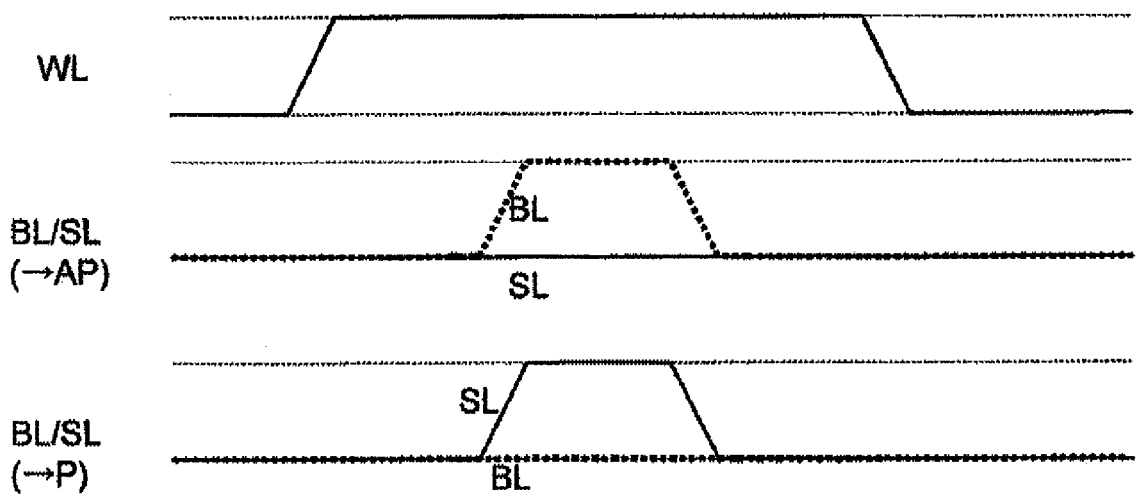
FIG. 5A is an example of operation waveform diagram of a memory cell according to the first embodiment.
Figure 5B:
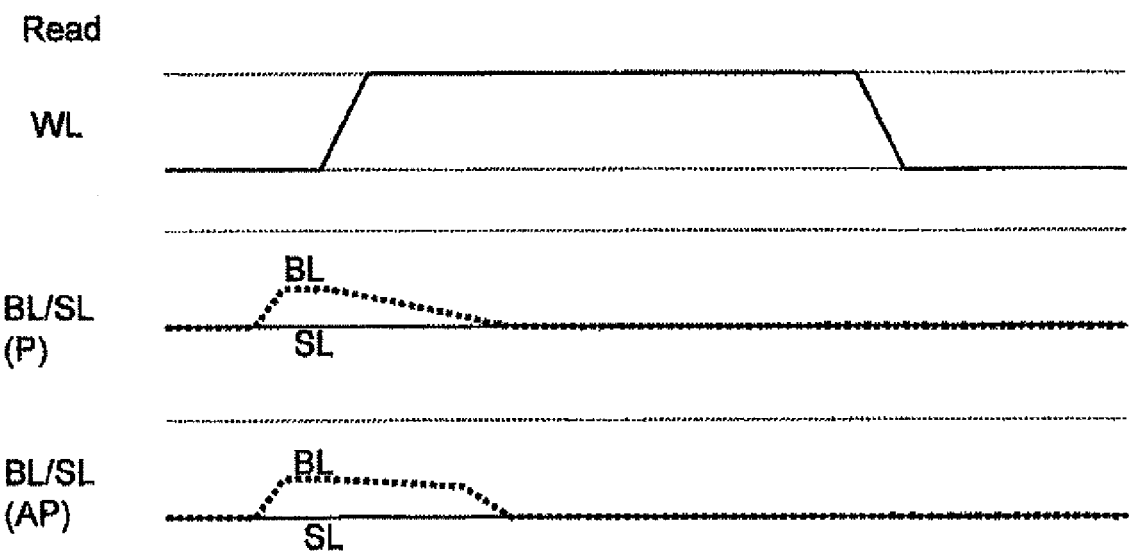
FIG. 5B is an example of operation waveform diagram of a memory cell according to the first embodiment.

FIG. 5A and FIG. 5B show operation timing of the bit lines BL, the source lines SL and word lines. FIG. 5A is a waveform diagram in writing operation, and FIG. 5B is a waveform diagram in reading operation. In the case where the memory cell is NMOS transistor, a non-selection state is set to a low voltage state, and the word lines WL corresponding to the address issued outside or inside of the chip, transit from a low potential state (VSS) to a high potential state (VWH). In the case of writing to an anti-parallel state which requires a larger current compared with the parallel writing (→AP), the bit lines are driven to the bit line driving level VBL and the source lines to a low potential (VSS). As a consequence, in the memory cell transistor MNT, since the source lines of the NMOS transistor have a lower potential than the drain, a source grounding state is generated so that a large current driving power can be realized. On the other hand, in the tunnel magneto-resistance element TMR, a current flows from the side of the fixed layer PL to the side of the free layer FL. Since the direction of flow of electrons is opposite to that of the current, the electrons flow from the side of the free layer FL to the side of the fixed layer PL. If the electrons flow in this direction, the spin direction of the free layer FL becomes opposite to that of the fixed layer PL. On the contrary, in the case of writing to a parallel state (→P), the source lines SL are driven to the bit line driving level VBL and the bit lines BL to a low potential (VSS). As a consequence, in the tunnel magneto-resistance element TMR a current flows from the side of the free layer FL to the side of the fixed layer PL, while electrodes flow from the fixed layer PL to the free layer FL. In the case of this current flow, the spin direction of the free layer FL becomes the same as that of the fixed layer PL.

Next, a reading operation will be explained. In a reading operation, a voltage of a degree which does not activate a writing operation in the element, namely, a reading voltage (VR) smaller than the bit line driving level (VBL) is applied to the magneto-resistance element, as a result, the cell state is read through the current which flows at that time. At this time, in order to secure a larger current, a voltage is applied in the same direction as the writing operation to an anti-parallel state in the writing operation described above. That is, in the case of the cell structure in which the fixed layer PL is arranged on the side of the bit lines, the bit lines BL are set to a higher potential compared with the source lines SL. Since the current required for writing to an anti-parallel state is larger than that for writing to a parallel state, by reading in the anti-parallel writing direction, the reading current can be increased, high-speed reading operation is enabled, and the margin between reading and writing currents can be enlarged.

Figure 6:
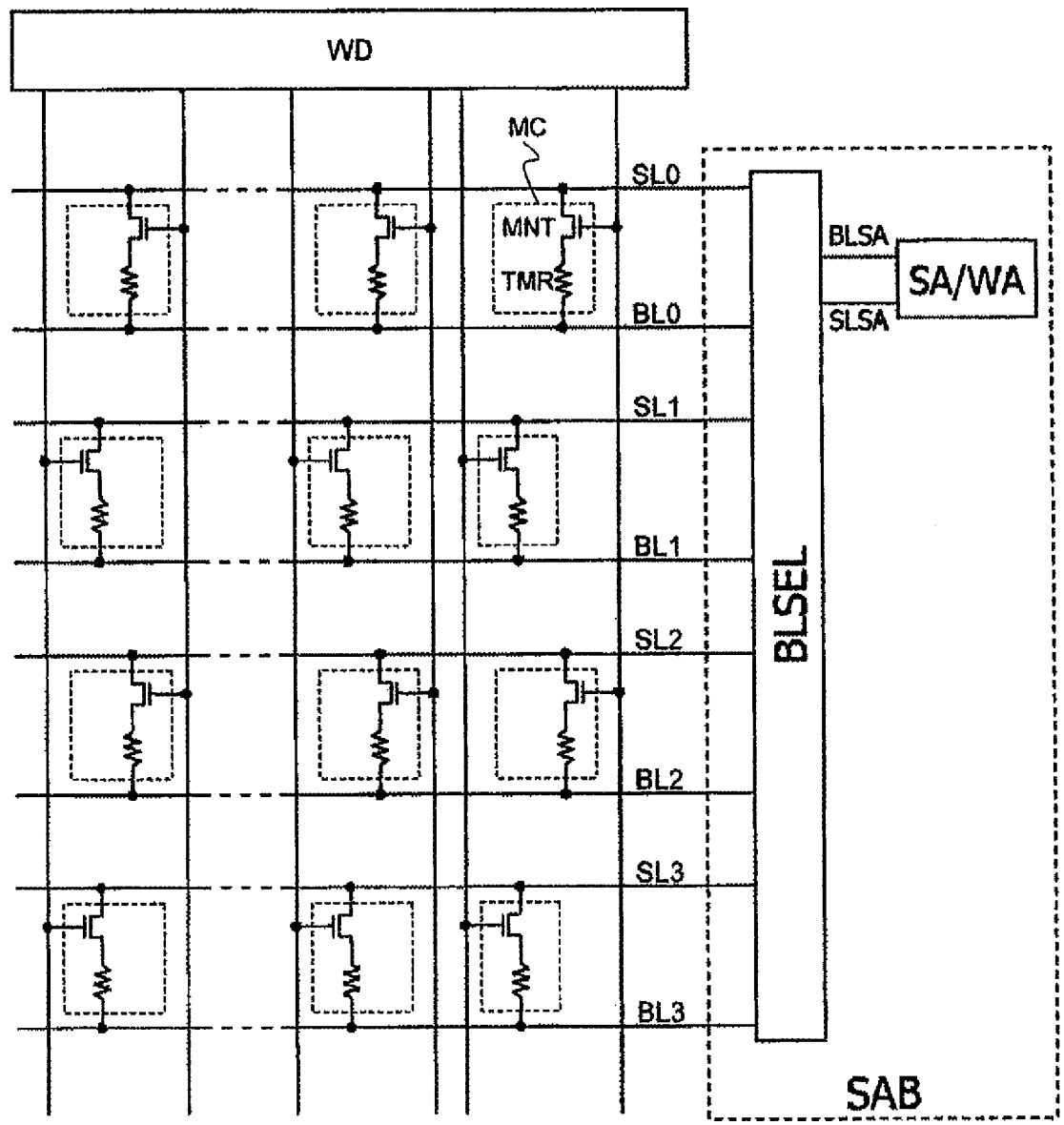
FIG. 6 is an example of another circuit diagram of a memory cell according to the first embodiment.

FIG. 6 is an example of a circuit diagram of the sense amplifier shown in FIG. 4. In FIG. 6, a memory cell MC is arranged at a half of the cross points of the word and bit lines. However, the memory cell may be arranged at all cross points. A layout view in this case will be described later. In the sense amplifier block SAB, a bit and source line selection circuit BLSEL, an SA for amplifying the small signal of the bit lines and a write amplifier WA for writing data in a memory cell are arranged. Although FIG. 6 shows an example in which four pairs of bit and word lines are connected to one sense amplifier and write amplifier, the circuit is not limited thereto. A sense amplifier and write amplifier may be connected to one pair of bit and word lines. In this case, the area thereof become large, but a sense amplifier is connected to all bit lines, it is preferable to the case where a large amount of data is output to the outside at one time. On the other hand, if one sense amplifier and write amplifier are arranged with respect to a plurality of pairs of bit and source lines such as four, eight or sixteen pairs thereof, the number of the circuits of the sense and write amplifiers can be reduced, as a result, an advantage that the area thereof can be reduced is obtained.

Figure 7:
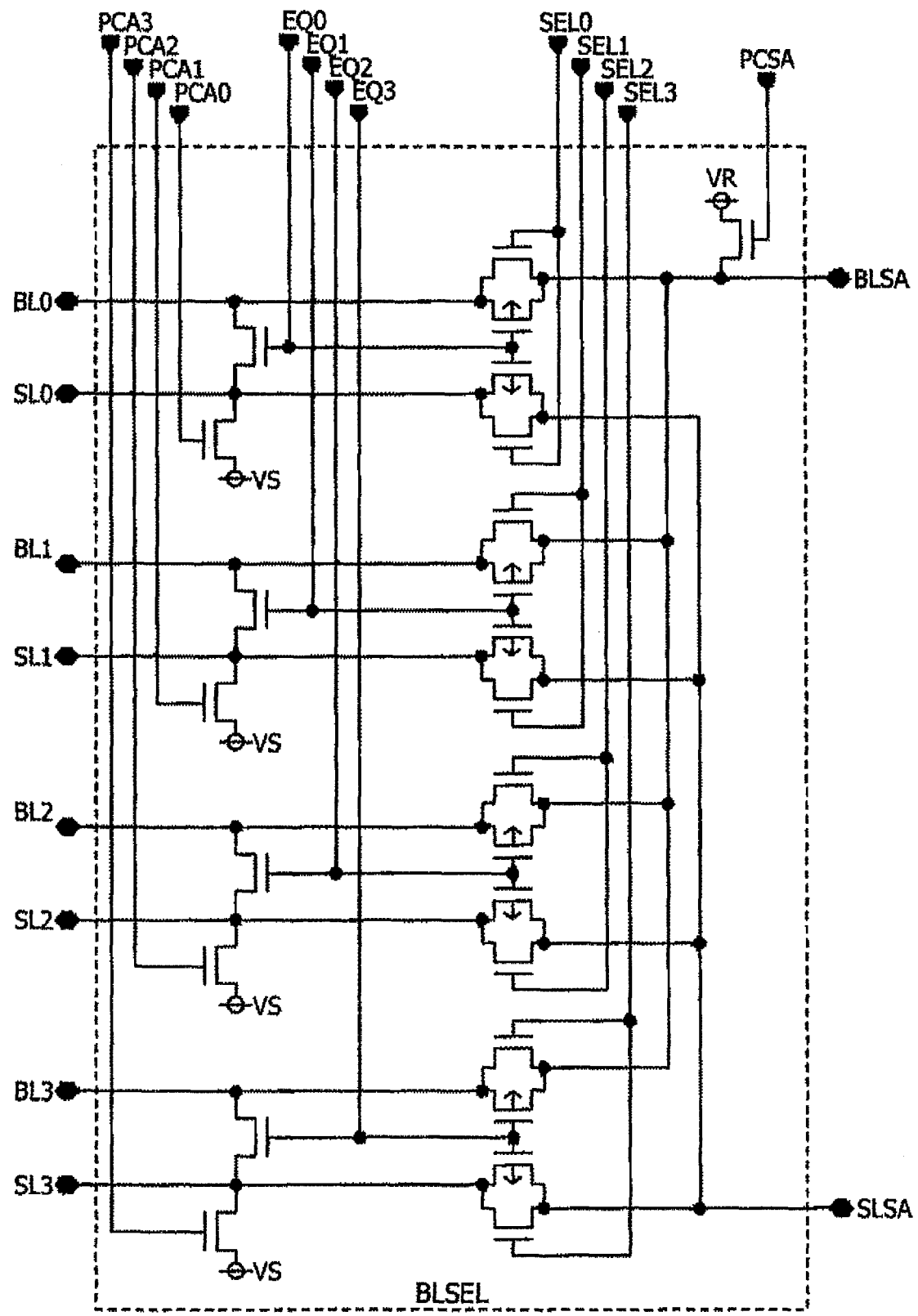
FIG. 7 is an example of a bit line selection circuit diagram of a sense amplifier section.

FIG. 7 shows an example of a circuit for selecting one pair of bit and source lines from four pairs of those lines by the bit line selection signals SEL0, SEL1, SEL2 and SEL3. This circuit includes an equalizer MOS for setting bit lines and source lines to a predetermined voltage VS in no-selected state using the equalizing signals EQ0, EQ1, EQ2, and EQ3 and the pre-charge signals PCA0, PCA1, PCA2 and PCA3, and a pre-charge circuit for setting those lines to a predetermined reading voltage using the sense amplifier pre-charge signal PCSA in the reading operation. This circuit is not limited to what is shown in FIG. 7 and another different circuit with the same function is included.

Figure 8:
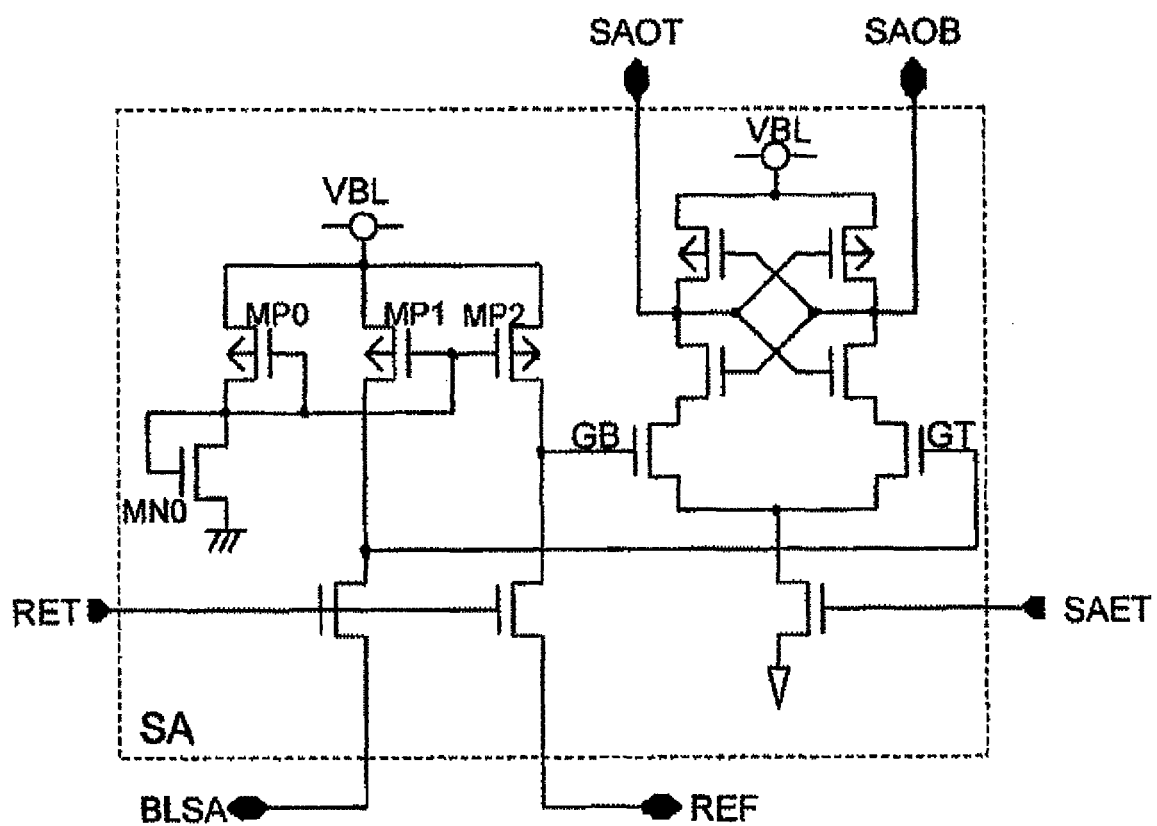
FIG. 8 is an example of a sense amplifier circuit.

FIG. 8 shows an example of a sense amplifier circuit. A read enable signal RET is a signal for controlling a switch for transmitting the reading current of the bit lines BLSA which is selected from an array to the sense amplifier. A sense amplifier activation signal SAE is a signal for activating a cross couple circuit for amplifying a signal obtained by voltage converting of a reading current. On one gate of two NMOS transistors arranged on the source of the cross couple, a voltage in which the reading current of the memory cell is reflected is input. On the other gate, a voltage in which a reference current for allowing an average current between parallel and anti-parallel states is reflected is input. The cross couple temporarily holds data for outputting it to the outside, and holds the data from the outside for writing operation.

Figure 9:
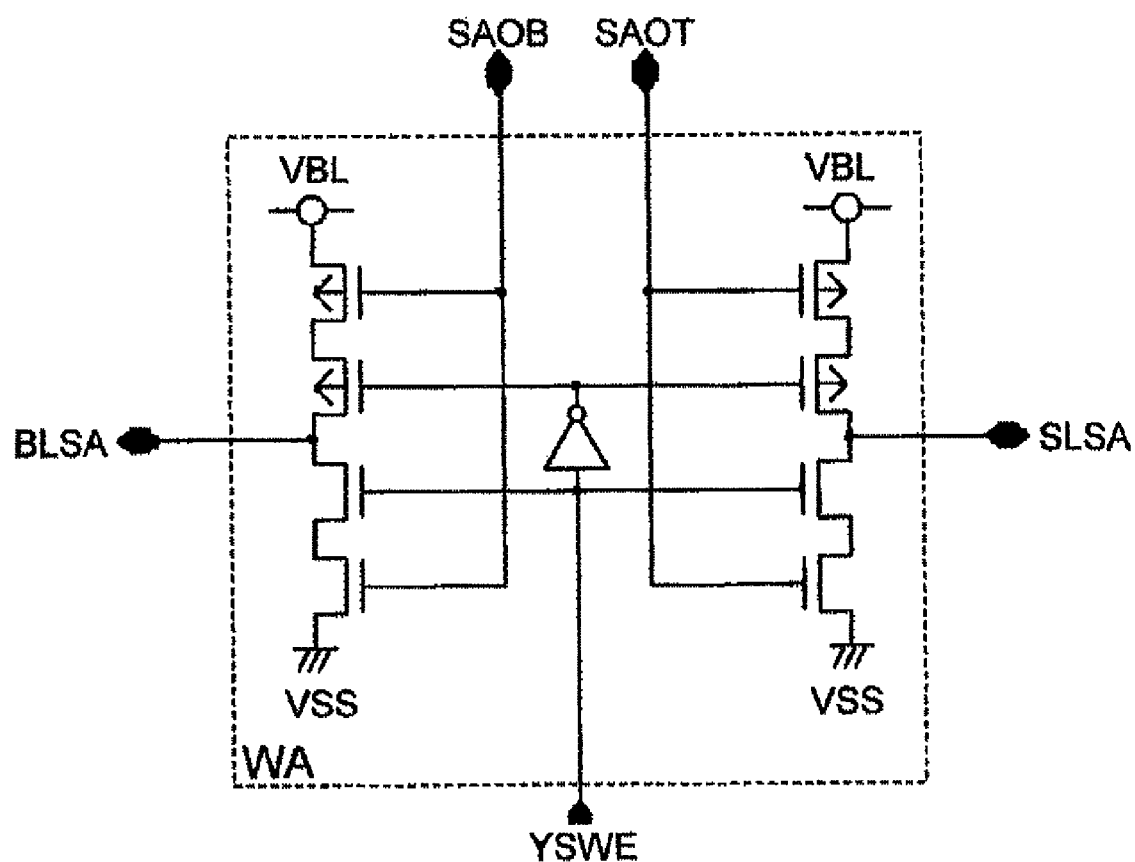
FIG. 9 is an example of a write amplifier circuit.

FIG. 9 shows an example of a write amplifier circuit for writing data into a memory cell. This circuit drives bit and source lines to a predetermined voltage, a low potential (VSS) or a bit line driving level VBL using the data held in the cross couple of the sense amplifier and the writing activation signal YSWE.

Figure 10:
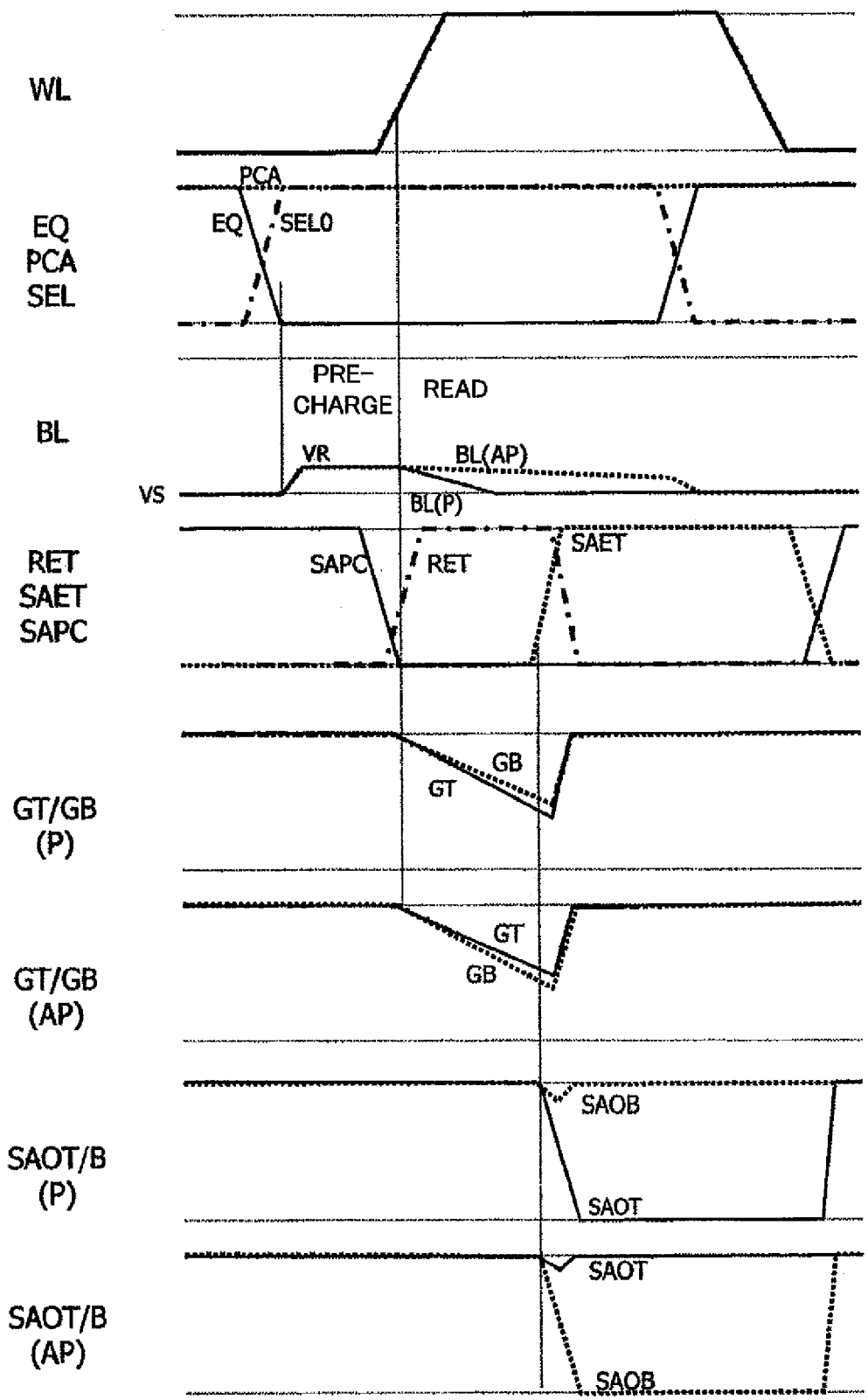
FIG. 10 is an example of reading operation waveform diagram according to the first embodiment.

Next, the reading operation using these circuits will be explained. FIG. 10 is a timing view of a reading operation. In reading operation, after input of the reading command, the equalizing signal corresponding to the reading address out of the equalizing signals EQ0, EQ1, EQ2, and EQ3 of the MOS which equalizes the bit lines BL and source lines in the array transits in order to terminate the equalizing. In FIG. 10, the equalize signal transits from the "H" state to the "L" state. At the same time, any of the bit line selection signals SEL0, SEL1, SEL2 and SEL3 corresponding to the reading bit line transits to a selection ('H') state. As a consequence, the selected bit line BL is pre-charged to the reading voltage VR. Thereafter, the sense amplifier pre-charge signal SAPC is set to a non-activated ('L') state, and the word line corresponding to the input address is then selected. At this time, in the case where the spin state of the tunnel magneto-resistance element TMR of the memory cell is set to an anti-parallel state (AP), the resistance value of the bit lines BL is large, therefore, the reading current becomes small, and a change amount from the reading level VR is kept small and at a level in the vicinity of VR. In the case where the spin state thereof is set to a parallel state (P), the resistance value is small, therefore, the reading current becomes large, and a change amount from the reading level VR becomes large and transits to a level in the vicinity of the source line level VS. The reading enable signal RET is activated almost at the same time as the word line, and the input GT to the sense amplifier transits from the 'H' state to the low voltage side. At this time, the input GB on the reference side is such that the current which provides an average between the low resistance and high resistance states is input by a dummy cell or the like. Therefore, in the case where the memory cell is set to a parallel state (P) (low resistance), the input GT of the sense amplifier has a lower potential than the input GB on the reference side, and in the case where the memory is set to an anti-parallel state (high resistance), the input GT of the sense amplifier has a higher potential than the input GB on the reference side. Thereafter, the sense amplifier activation signal SAET is activated before the reading enable signal is set to a non-selected state. As a consequence, small signal of the sense amplifier input GT/GB is amplified to a predetermined voltage amplitude VBL at the sense amplifier output SAOT/B, and the process moves to a column selection operation. In a column selection operation, the column selection signal YS is activated so that the data is output to a common I/O line and finally to the outside. When the reading operation is completed and a pre-charge operation started, the equalizing signal for short-circuiting the bit line and the source lines is activated, and at the same time, the bit line selection signal SEL is set to a non-selected state. Before or after that, the word lines transit to a non-selected state. Thereafter, the bit line SABL in the sense amplifier is pre-charged to a predetermined level by the sense amplifier pre-charge signal SAPC.

Figure 11:
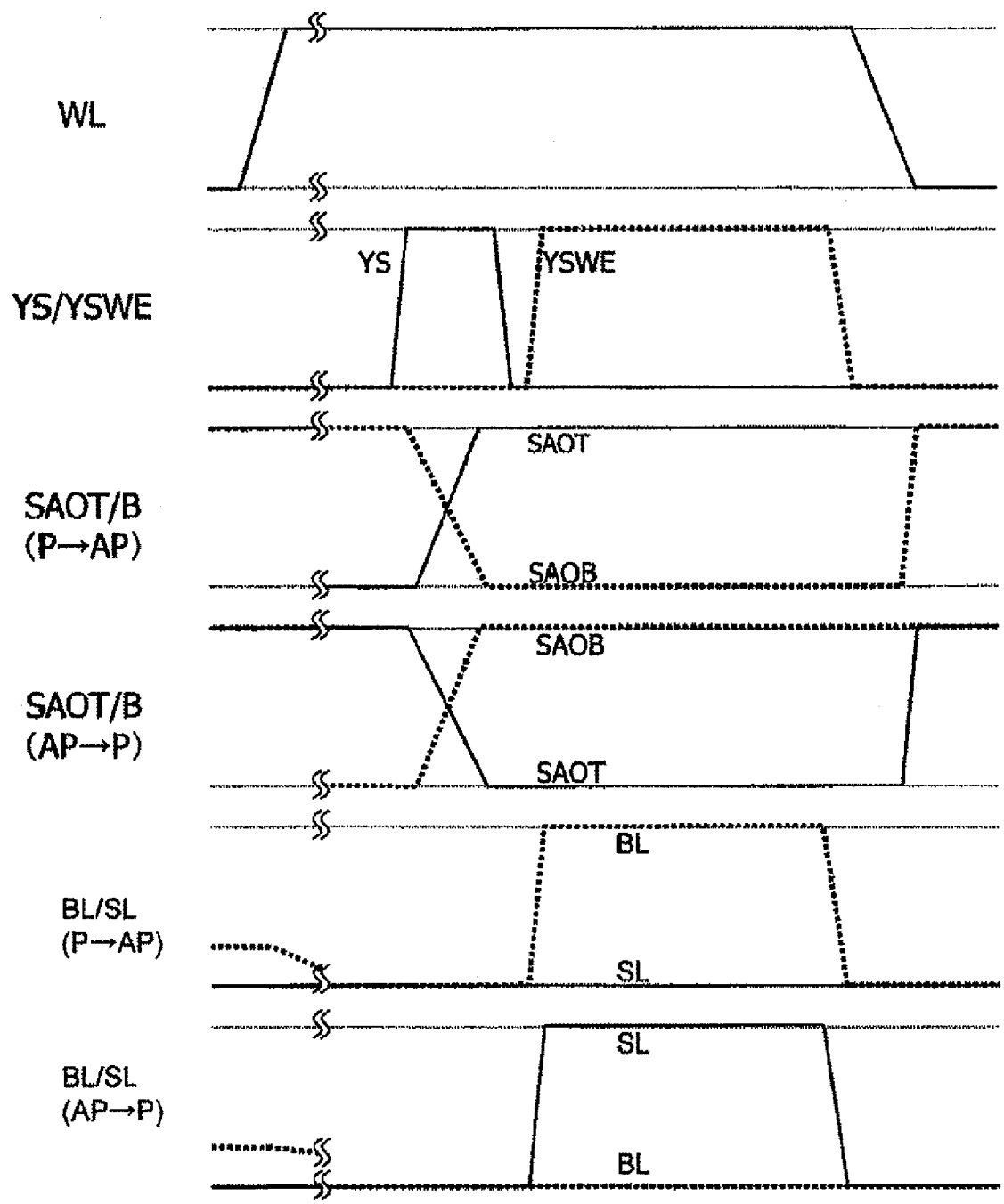
FIG. 11 is an example of writing operation waveform diagram according to the first embodiment.

Next, a writing operation will be explained using FIG. 11. Up to the column selection operation, the operations are the same as the reading operation aforementioned. Note that, in the case where the reading operation is not required, only the activation operation of the sense amplifier should be performed. FIG. 11 shows operation waveform diagrams of a writing operation from a parallel state to an anti-parallel state (P→AP) and a writing operation from an anti-parallel state to a parallel state (AP→P). An explanation will be made from the process in which the column selection line YS is input and the data latched in the sense amplifier are reversed. At the anti-parallel writing sense amplifier, the sense amplifier output node SAOT holds the "H" state and the sense amplifier output node SAOB the "L" state by the reversion writing. On the contrary, at the parallel writing sense amplifier, the sense amplifier output nodes SAOT holds the "L" state and the sense amplifier output node SAOB the "H" state. Then, the column writing signal YSWE is input. Consequently, at the writing circuit, the source lines SL are driven to a low potential (VSS) and the bit lines BL are driven to a bit line driving level (VBL) in the anti-parallel writing. Therefore, since the memory cell transistor MNT is NMOS type, the source line side is set to a low potential (VSS), the operation is performed by the source grounding in which a current driving power is large. At this time, at the magneto-resistance element, a current flows from the fixed layer PL to the free layer FL. Since electrons flow in the opposite direction to the current, electrons flow from the free layer FL to the fixed layer PL, and anti-parallel writing operation is performed. That is, an operation with a large driving power of the cell transistor corresponds to the anti-parallel writing operation. As the result, a voltage required for a writing operation can be reduced and the memory cell transistor MNT can be made smaller in size, which leads to a decrease in the area. On the contrary, in a parallel writing operation, the bit lines are driven to a low potential (VSS) and the source lines to a bit line driving level (VBL). At this time, at the magneto-resistance element, a current flows from the free layer FL to the fixed layer PL. Since electrons flow in the opposite direction to the current, electrons flow from the fixed layer PL to the free layer FL, and parallel writing operation is performed.

Advantages of the present structure are described below. In the case where the fixed layer is arranged on the side of the bit lines of the tunnel magneto-resistance element TMR, by using NMOS as a memory cell transistor MNT, the anti-parallel writing operation which requires a large current can be performed in the source grounding operation having a large current driving power of the memory cell transistor MNT. Therefore, the area of the memory cell can be made smaller and the required voltage at the writing time can be reduced. Furthermore, in the reading operation, since a voltage is applied in the same direction as at the anti-parallel writing time, the reading current can be increased, a high-speed reading operation is enabled, and the margin between reading and writing currents can be enlarged.

Figure 12:
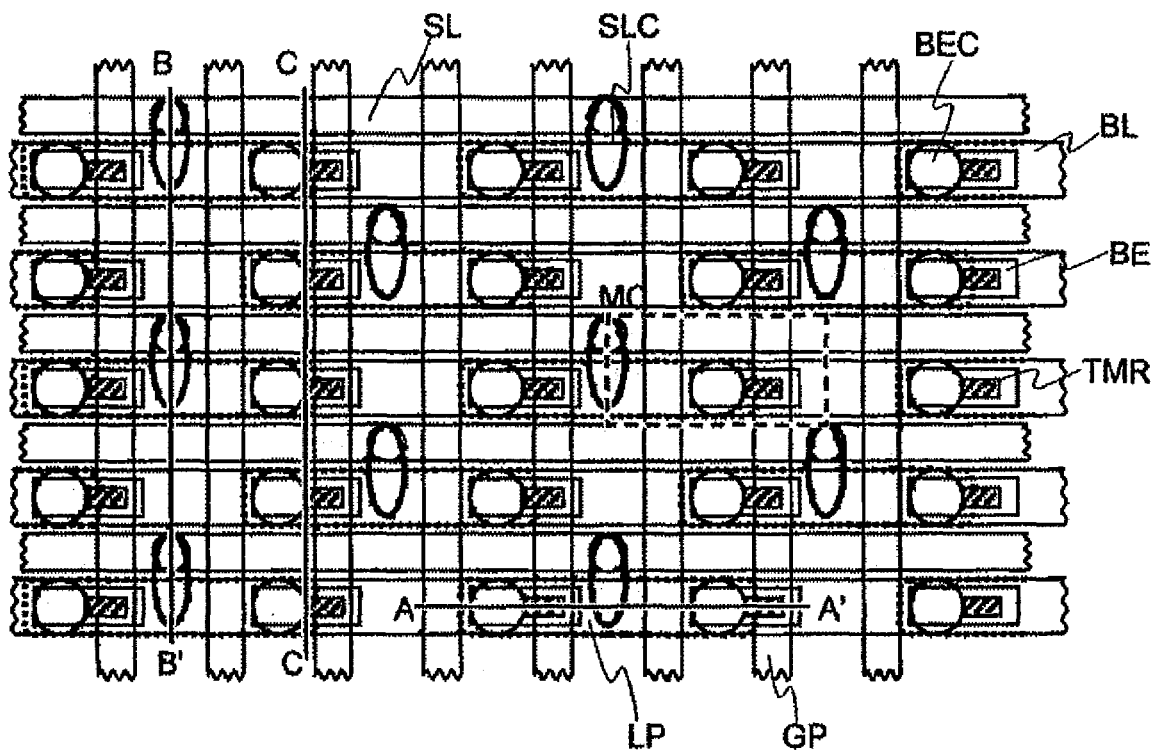
FIG. 12 is a layout view of a memory cell according to a variation of the first embodiment.
Figure 13:
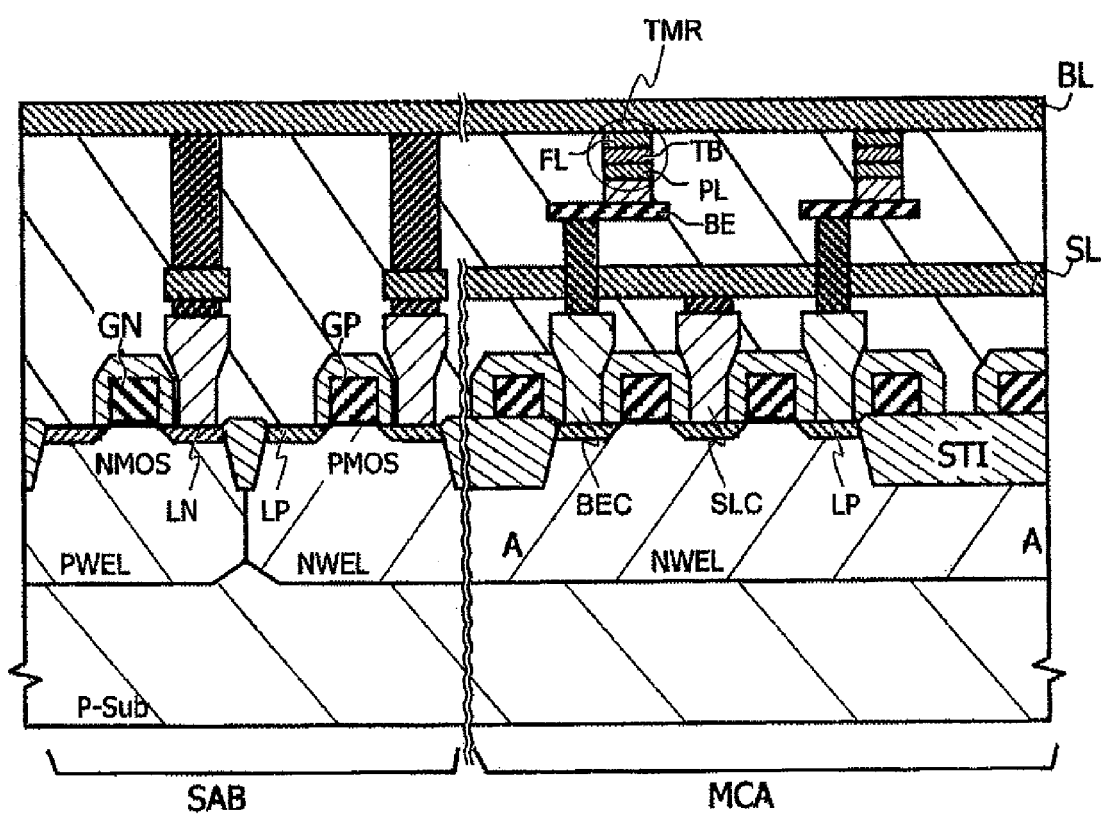
FIG. 13 is a sectional view of a memory cell and sense amplifier block according to a variation of the first embodiment.
Figure 14:
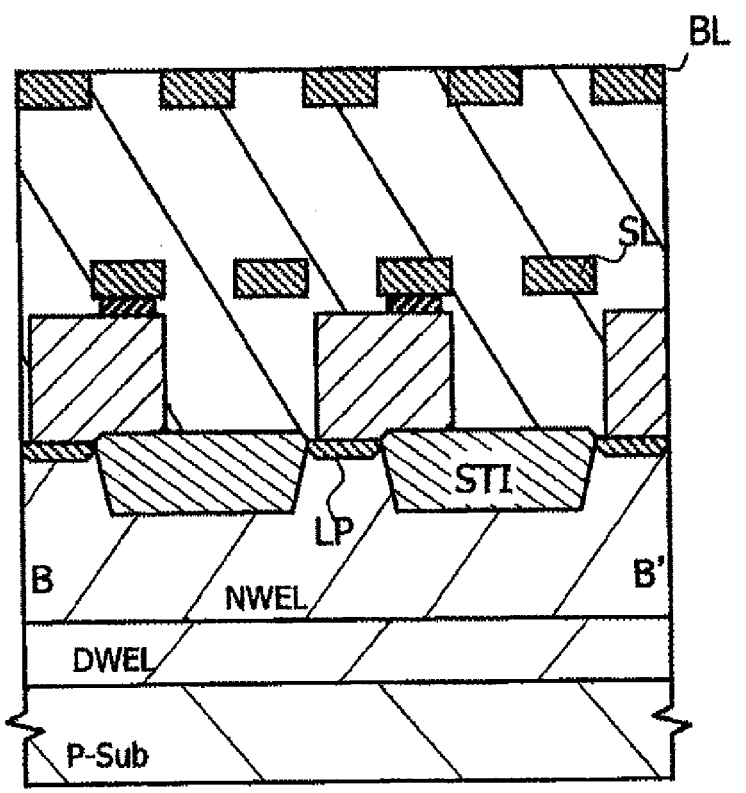
FIG. 14 is sectional views of a memory cell according to a variation of the first embodiment.
Figure 14:
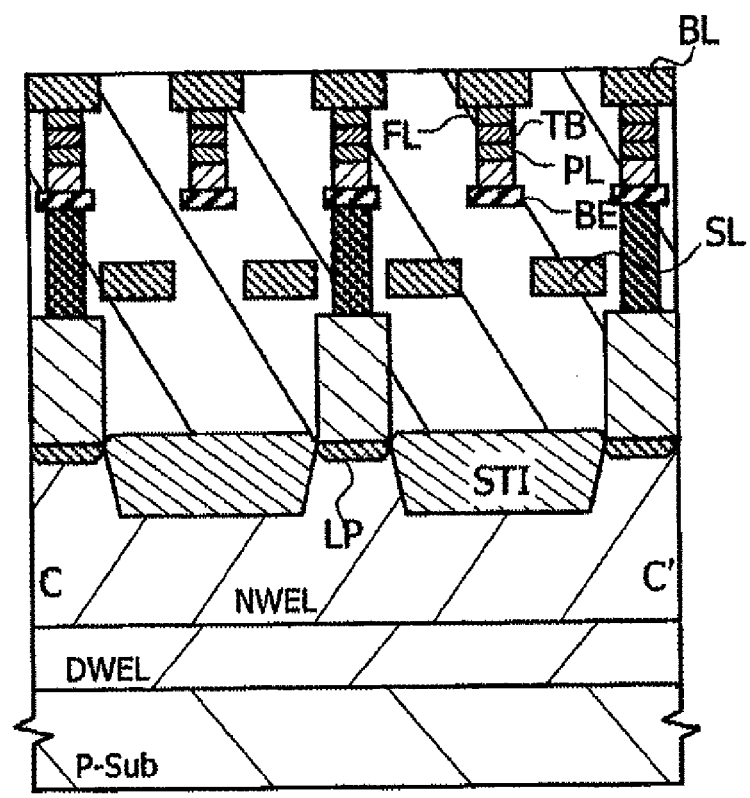

Next, a variation example of the first embodiment is described. In this example, a structure of the layers of the tunnel magneto-resistance element TMR is different from FIGS. 1, 2 and 3, the fixed layer PL is arranged on the transistor side and the free layer FL is located on the side of the common lines (bit lines). In this case, the example is characterized in that the memory cell transistor is constituted with the PMOS in order to realize the anti-parallel writing operation in the source grounding state of the memory cell transistor. FIG. 12 is a layout view. FIG. 13 is a sectional view taken along the line A-A' in FIG. 12 and a sectional view of a peripheral circuit. FIG. 14 is sectional views taken along the lines B-B' and C-C', respectively, in FIG. 12. As compared with the aforementioned embodiment, the present example is different in that the gate electrode GP is constituted on the basis of a P-type polysilicon, the diffusion layer LP is constituted in the P-type semiconductor area, the cell transistor is formed in the N-type semiconductor area NWEL, and the structure of the tunnel magneto-resistance element TMR is reversed upside down. Furthermore, the N-type semiconductor area NWEL in which the memory cell transistor is formed may be commonly used with or separated from the N-type semiconductor area NWEL of the adjacent sense amplifier SAB. By the common use, the separation area of the N-type semiconductor area NWEL can be reduced and the area can be made smaller. By the separation, on the other hand, although the area is increased, an advantage that the substrate voltage can be independently controlled in the sense amplifier block SAB and the memory cell area is obtained. With respect to other points, the same applies as the aforementioned FIGS. 1 through 3. The circuit structure and the operation waveform are the same as shown in FIGS. 4 through 11. Note that, the memory cell transistor is PMOS type, and the up and down positions of the free layer FL and the fixed layer PL are set in an opposite manner, as a result, the polarity of the voltage applied must be changed accordingly.

Advantages of the present structure are described below. In the case where PMOS is used in a memory transistor, by forming the structure of the tunnel magneto-resistance element TMR in such a manner that the fixed layer PL is arranged on the side of the memory cell transistor and the free layer FL is arranged on the side of the common lines (bit lines), anti-parallel writing operation which requires a large current can be performed in the source grounding operation having a large current driving power of the memory cell transistor. As a result, the area of the memory cell can be smaller and the required voltage at the writing can be reduced. Furthermore, in the reading operation, since a voltage is applied in the same direction as at the anti-parallel writing operation, there is an advantage that the reading current can be increased, a high-speed reading operation is enabled, and the margin between reading and writing currents can be enlarged.

Figure 15:
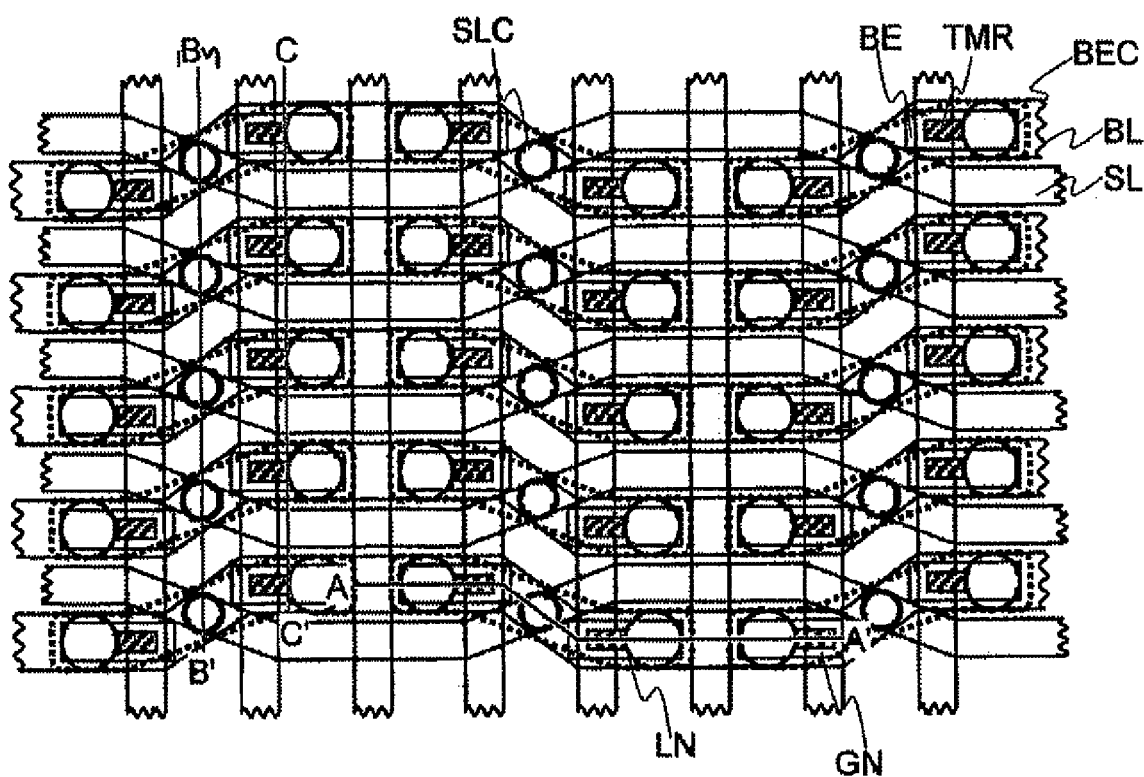
FIG. 15 is a layout example of a memory cell according to another variation of the first embodiment.
Figure 16:
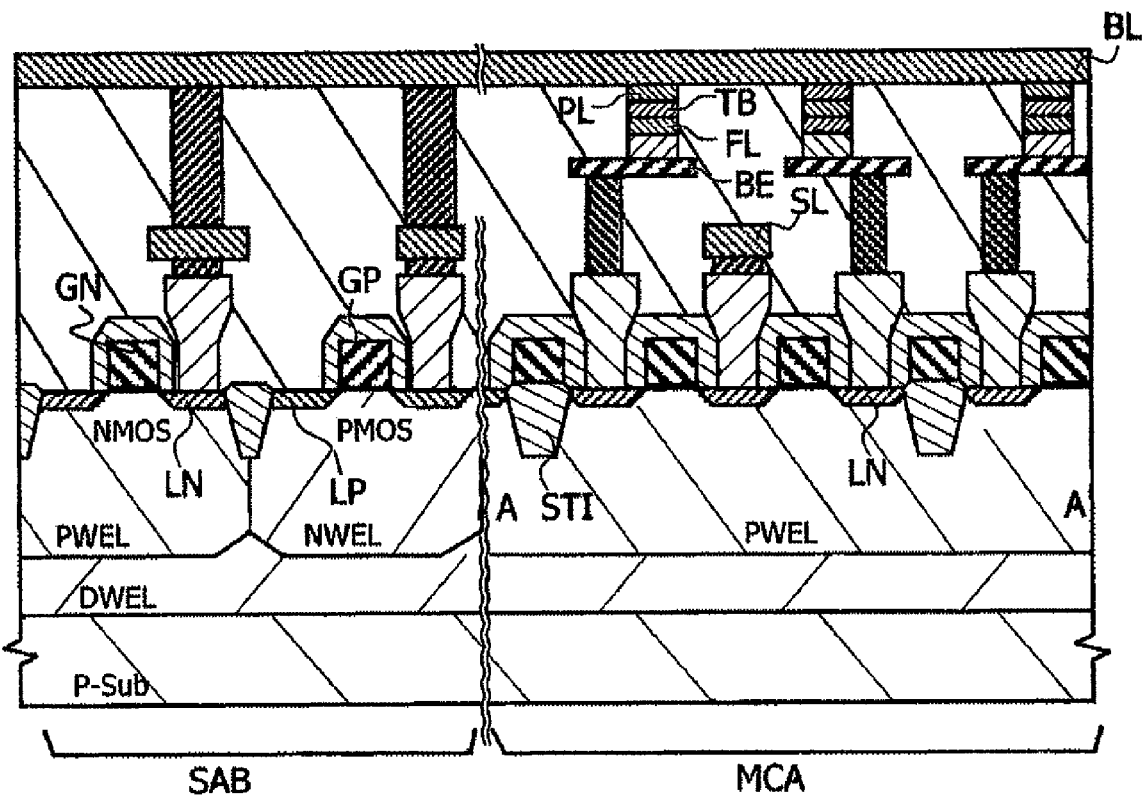
FIG. 16 is a sectional view of a memory cell and sense amplifier block according to another variation of the first embodiment.
Figure 17:
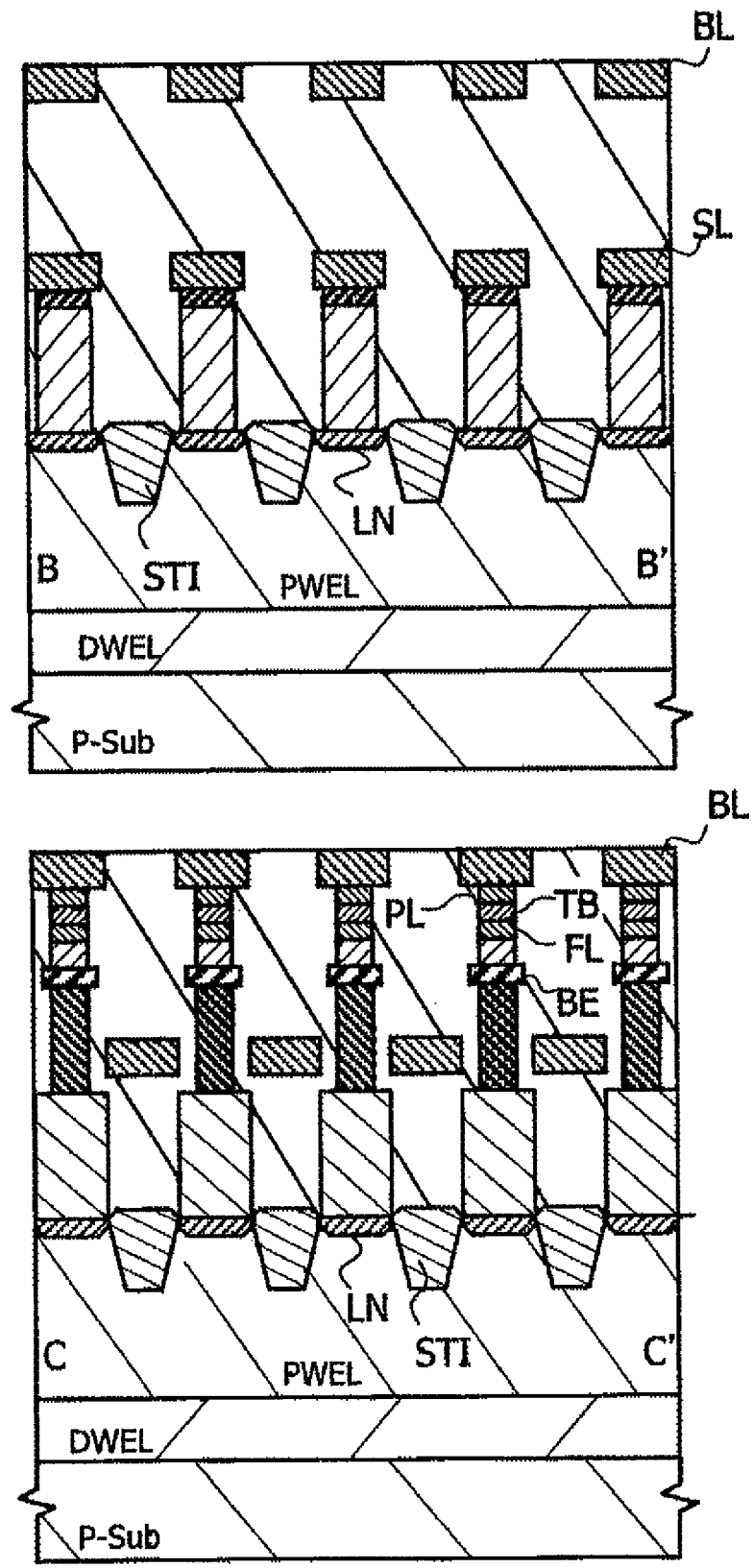
FIG. 17 is sectional views of a memory cell according to another variation of the first embodiment.

Another variation example of the first embodiment will be shown in FIGS. 15 through 17. In this structure, memory cells are arranged at all the cross points of word lines and bit lines, and the area of the memory cell is given as $6F^2$ in the case where the wiring pitch of the word and bit lines is assumed to be 2F, as a result, the memory cell can be further smaller in size. FIG. 15 is a layout view. FIG. 16 is a sectional view taken along the line A-A' in FIG. 15 and a sectional view of a peripheral circuit. FIG. 16 is sectional views taken along the lines B-B' and C-C', respectively, in FIG. 15.

As shown in FIG. 15, in this layout, the bit lines BL and the source lines are arranged to provide mirror symmetry. And at the cross point thereof, the source line contact SLC is arranged. A diffusion layer LN is formed in the same pattern as the bit lines BL. In an area of the diffusion layer LN where no source line contact SLC is arranged, the bottom electrode contact BEC is arranged. On a layer upper than the bottom electrode contact, a bottom electrode BE is formed. On the bottom electrode BE, a tunnel magneto-resistance element TMR is formed. The tunnel magneto-resistance element is formed in an ellipse or rectangular shape in which the extension direction of the bit lines is longer than that of the word lines. On a layer upper than the tunnel magneto-resistance element TMR, the bit lines BL are wired. In the case where the memory cell transistor is PMOS type like the first embodiment, a structure of the tunnel magneto-resistance element TMR is preferable in which the free layer FL is arranged between the tunnel film TB and the bit lines BL in order to secure a large anti-parallel current. On the contrary, in the case where the fixed layer PL is arranged between the tunnel film TB and the bit lines, a structure in which NMOS is used as a memory cell transistor is preferable in order to secure an anti-parallel current.

Advantages of the present structure are described below. In the case where PMOS is used as a memory cell transistor, the tunnel magneto-resistance element TMR is formed in a structure in which the fixed layer PL is arranged on the side of the memory cell transistor and the free layer FL is arranged on the side of the common lines (bit lines). In the case where the fixed layer is arranged on the side of common lines, NMOS is used as a memory cell transistor. Consequently, the anti-parallel writing operation which requires a large current can be performed in the source grounding operation having a large current driving power of the memory cell transistor. Thus, the area of the memory cell can be decreased and the required voltage at the writing can be reduced. Furthermore, the area of the memory cell can be decreased to a minimum of $6F^2$. And, in the reading operation, by applying a voltage in the same direction as at the anti-parallel writing operation and performing a reading operation, the reading current can be increased, a high-speed reading operation is enabled, and the margin between reading and writing currents can be enlarged.

Figure 18:
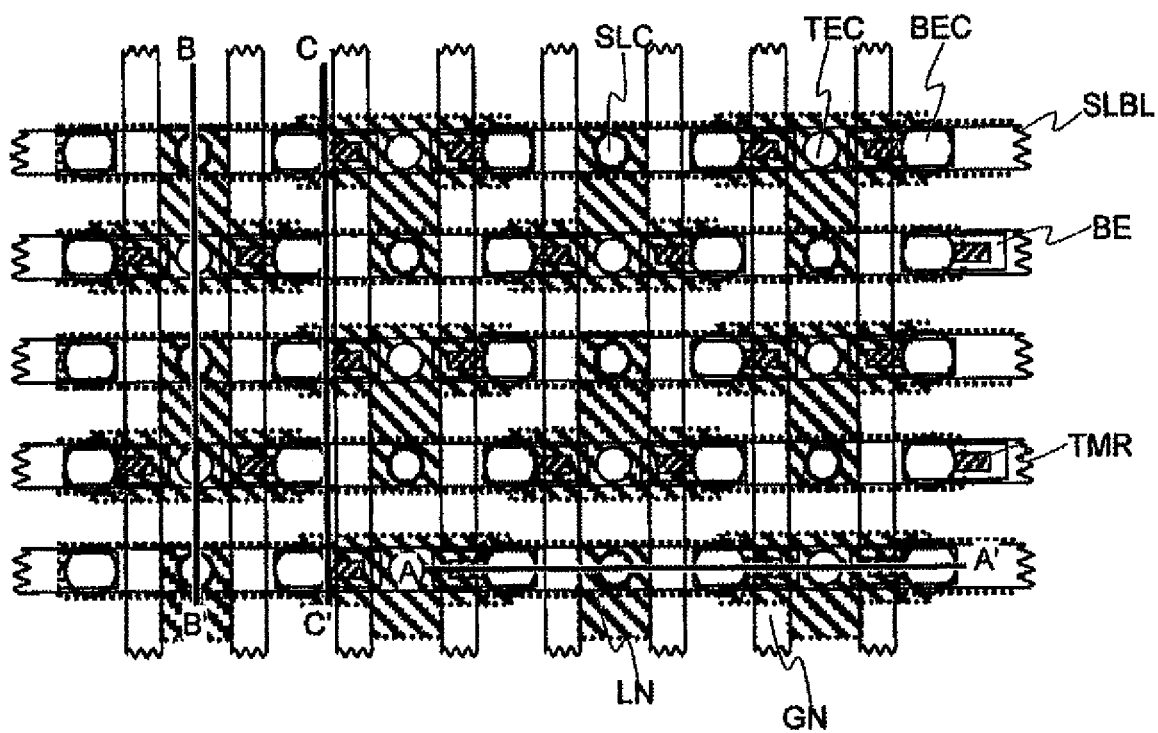
FIG. 18 is a layout example of a memory cell according to another variation of the first embodiment.
Figure 19:
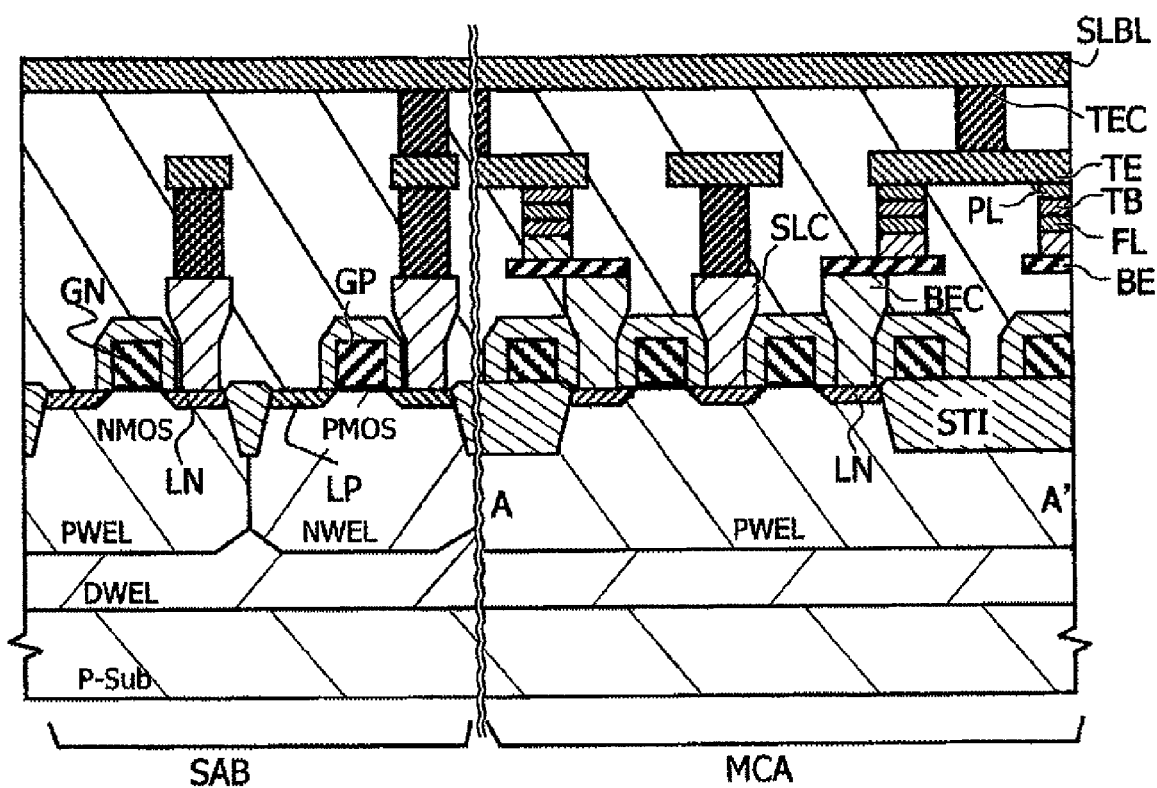
FIG. 19 is a sectional view of a memory cell and sense amplifier block according to another variation of the first embodiment.
Figure 20:
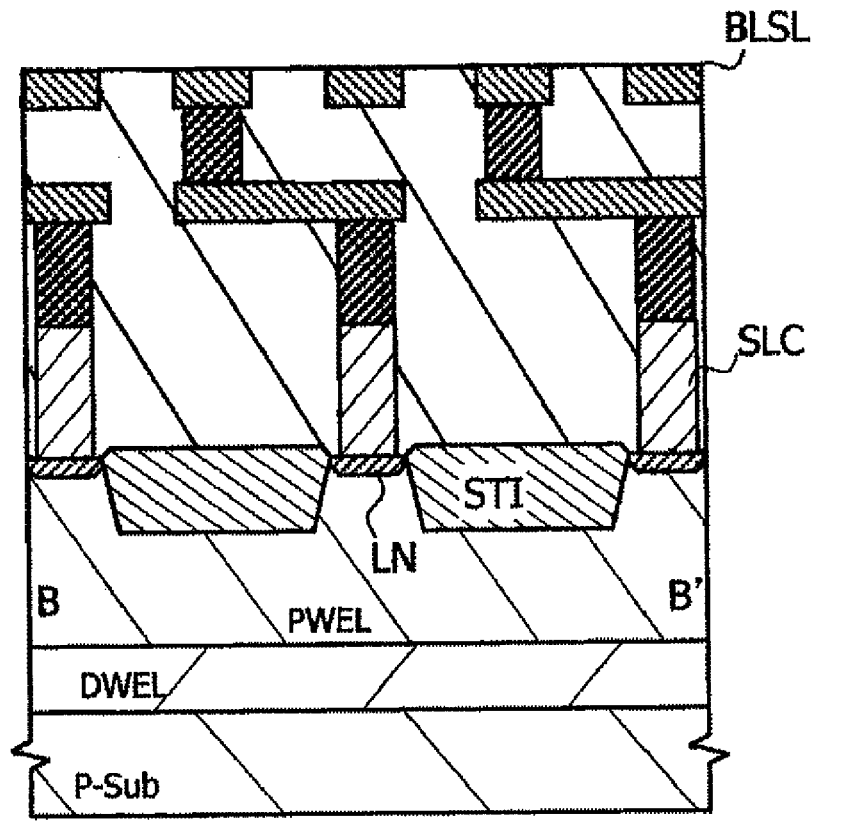
FIG. 20 is sectional views of a memory cell according to another variation of the first embodiment.
Figure 20:
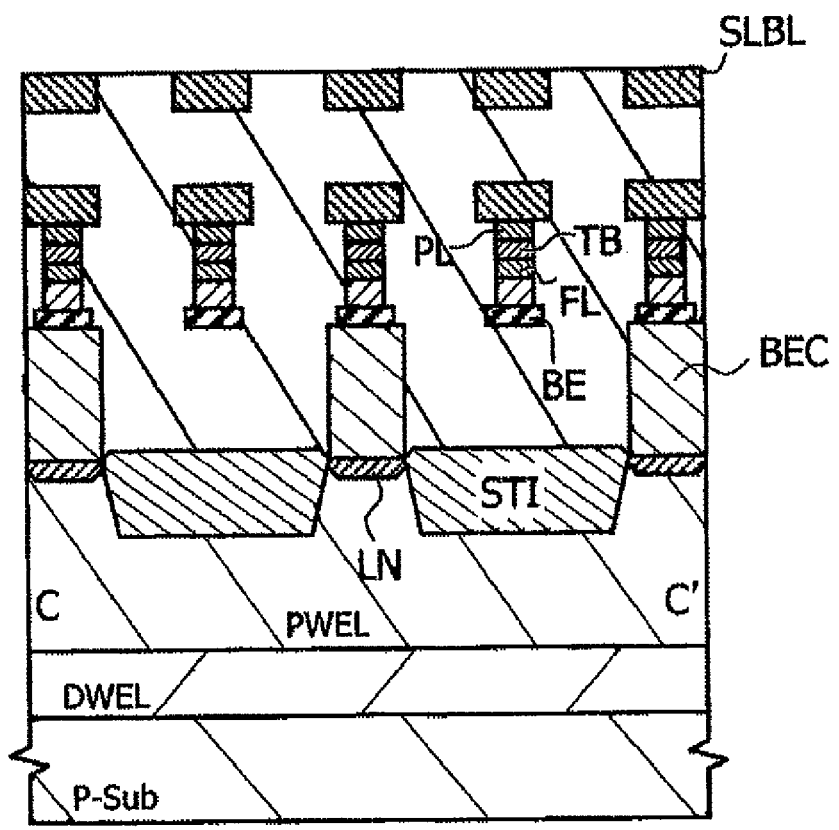
Figure 21:
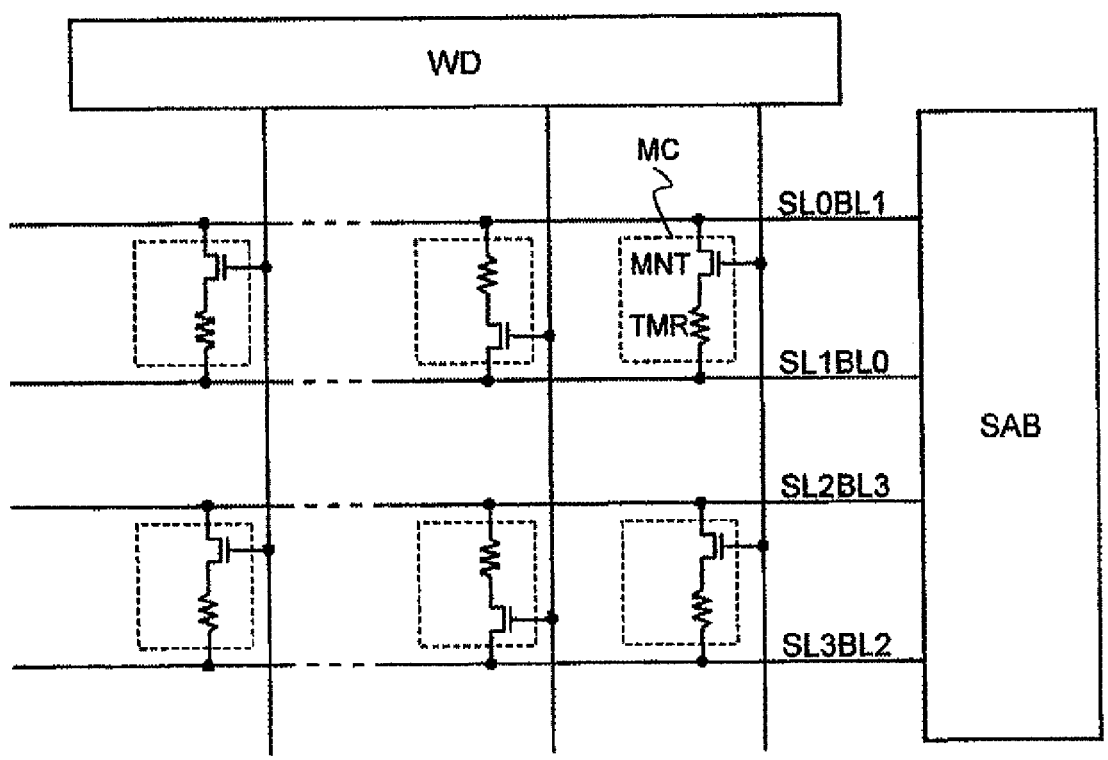
FIG. 21 is an example of circuit diagram of the memory cell array corresponding to FIG. 18.

Another variation of the first embodiment is shown in FIGS. 18 to 21. This structure is characterized in that the bit lines BL and the source lines are interchanged between adjacent memory cells and connected so that the wiring structure is simplified. The area of the memory cell is $8F^2$ in the same manner as the first embodiment. FIG. 18 is a layout view. FIG. 19 is a sectional view taken along the line A-A' in FIG. 18 and a sectional view of a peripheral circuit. FIG. 20 is sectional views taken along the lines B-B' and C-C', respectively, in FIG. 18. FIG. 21 is a circuit diagram of FIG. 18. FIG. 18 shows an example of a memory cell transistor composed of NMOS transistors. By sharing the source line contact SLC by two memory cell, the area is decreased. In an area of the diffusion layer LN where no source line contact SLC arranged, the bottom electrode contact BEC is arranged. On the bottom electrode contact, a bottom electrode BE is arranged. On the bottom electrode BE, a tunnel magneto-resistance element TMR is formed. In FIG. 18, the free layer FL is arranged on the transistor side with respect to the tunnel film, and the fixed layer PL is arranged on the side of the bit lines with respect to the tunnel film TB. On the tunnel magneto-resistance element TMR, a top electrode TE is formed. The top electrode TE is commonly connected with the adjacent memory cells on the same bit line, and is connected to the source line contact SLC of the adjacent bit lines to form a T-like configuration. As a consequence, by connecting the specific bit lines BL with the source lines SL of the adjacent memory cells connected to the adjacent bit lines BL, the number of wirings can be reduced and the wiring pattern can be simplified.

Figure 22:
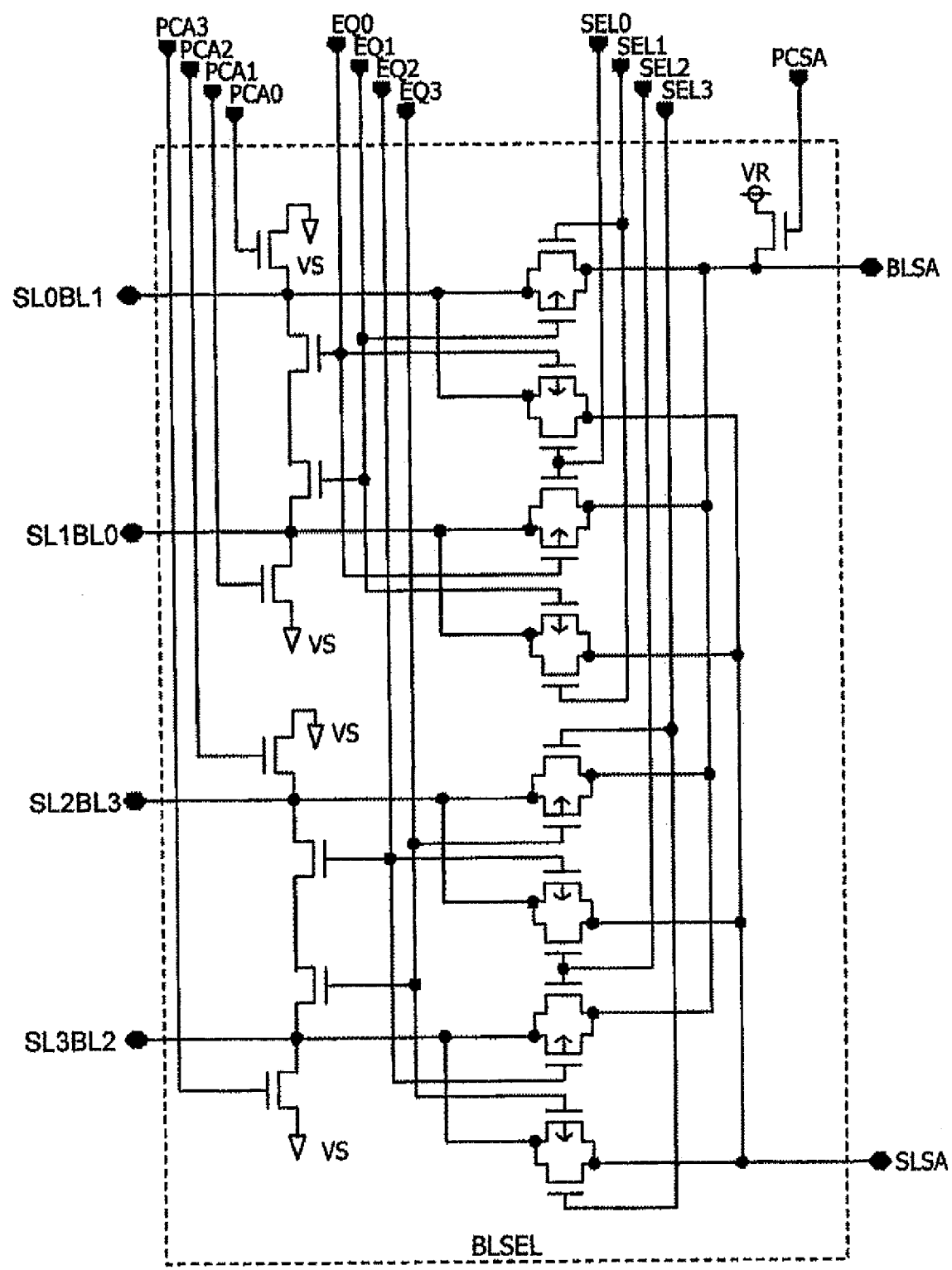
FIG. 22 is an example of a bit line selection circuit diagram of the sense amplifier section corresponding to FIG. 18.

There will be explained a bit and source line selection circuit BLSEL corresponding to this memory cell structure, by reference to FIG. 22. In this circuit example, one of the four bit and source common lines is connected to the bit line SABL in the sense amplifier, and the another one paired with which is connected to the source line SLSA. The bit and source common line pairs SL0BL1 and SL1BL0 as well as SL2BL3 and SL3BL2 which are drawn out of the memory array are configured in a manner that while one of the common lines serves as a source line, the other serves as a bit line. For example, when the bit and source common line SL0BL1 serve as a source line, SL1BL0 serves as a bit line, and the lines are connected to the source line SLSA and the bit line SABL in the sense amplifier, respectively. At this time, PCA0 is driven as a corresponding pre-charge signal, SEL0 as a bit line selection signal, and EQ0 as an equalizing signal. On the contrary, when the bit and source common line SL0BL1 serve as a bit line, SL1BL0 serves as a source line, and the lines are connected to the source line SLSA and the bit line SLBL in the sense amplifier, respectively. PCA1 is driven as a corresponding array pre-charge signal, SEL1 as a bit line selection signal, and EQ1 as an equalize signal. The same applies to the bit and source common line pairs SL2BL3 and SL3BL2. Other reading and writing operations are the same as those according to the aforementioned embodiment 1.

Advantages of the present structure are described below. In the same manner as the aforementioned embodiment 1 and the variation thereof, the anti-parallel writing operation which requires a large current for writing can be performed in the source grounding operation, so the area of the memory cell can be smaller. Also, by performing a reading operation in the same direction as the anti-parallel writing operation, the reading margin can be improved. Furthermore, there is provided an advantage that the wiring structure can be simplified by sharing the bit and source lines with the adjacent cells.

Embodiment 2

Figure 23:
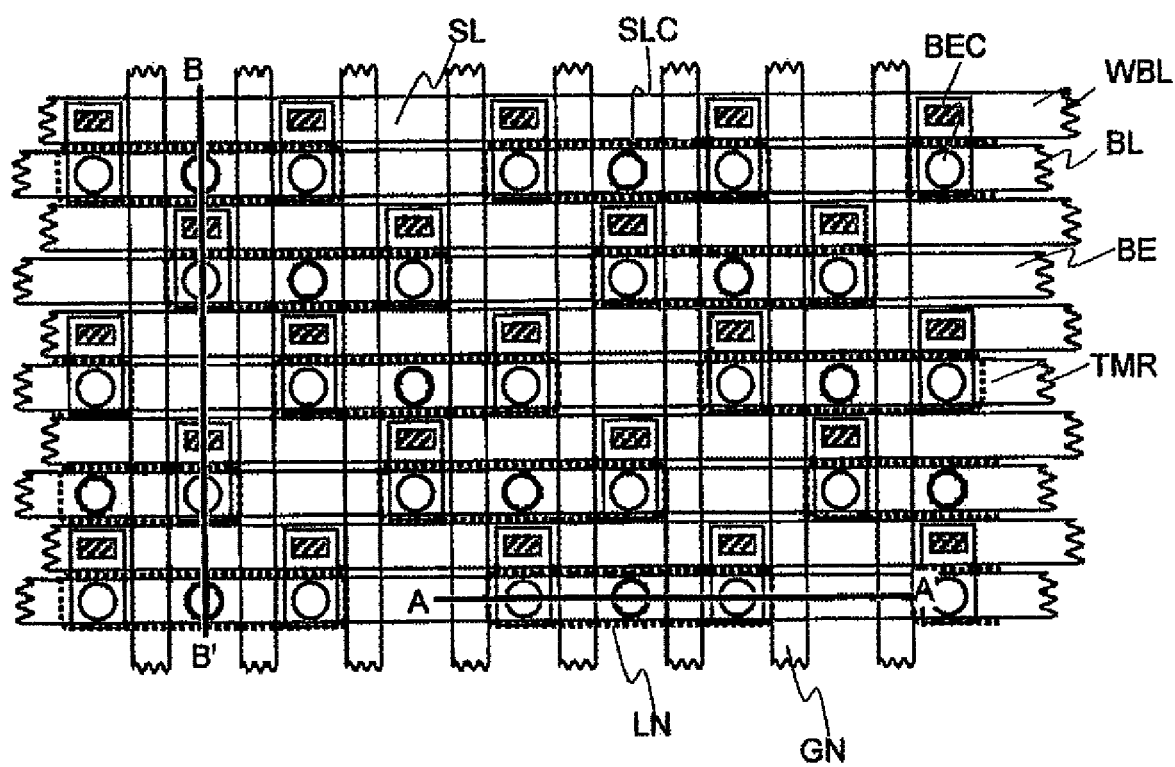
FIG. 23 is a layout example of a memory cell according to a second embodiment.
Figure 24:
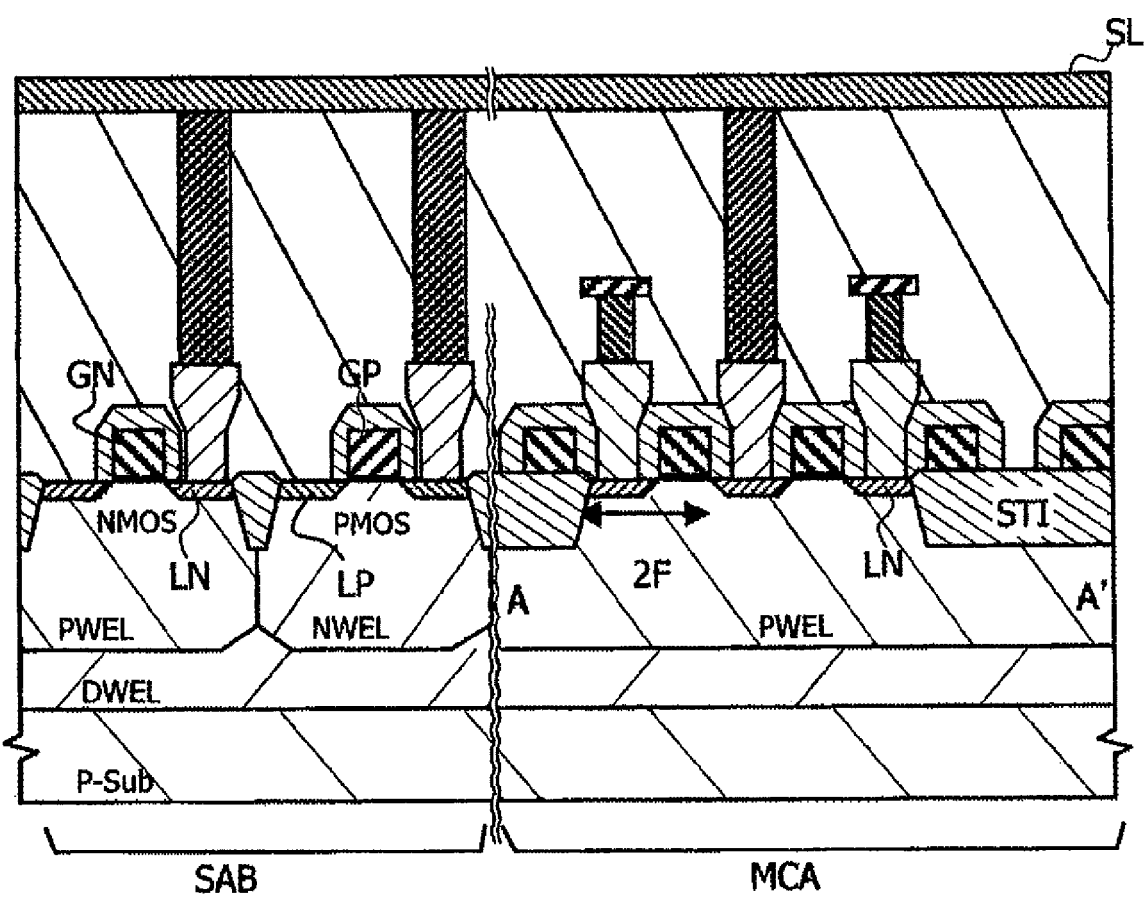
FIG. 24 is a sectional view of a memory cell and sense amplifier block according to the second embodiment.
Figure 25:
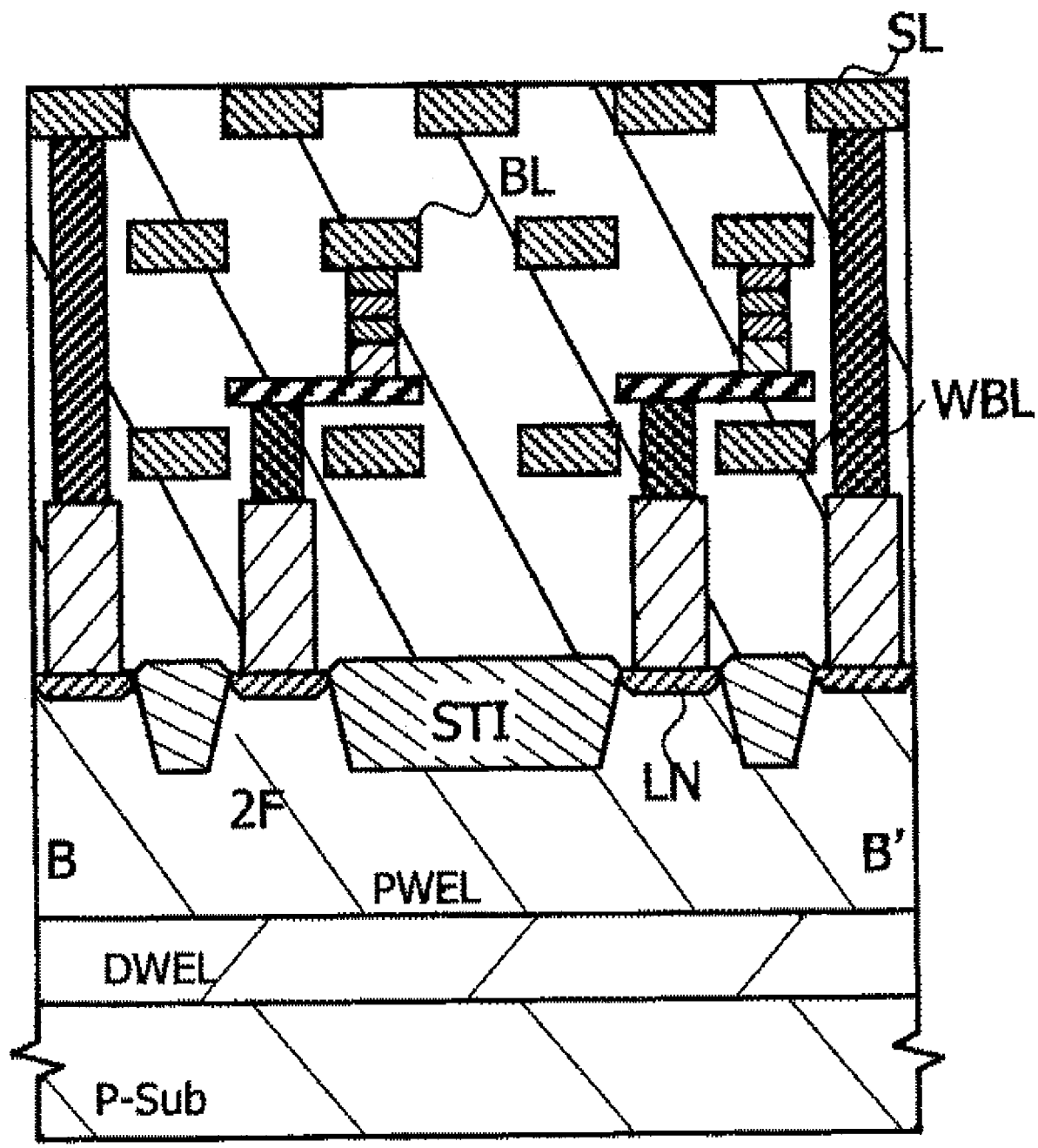
FIG. 25 is a sectional view of a memory cell according to the second embodiment.

There will be explained the second embodiment of the present invention by reference to FIGS. 23 through 25. In this structure, on a lower portion of the tunnel magneto-resistance element TMR which constitutes a memory cell, writing bit lines WBL for exciting a magnetic field for reducing the writing current at the writing time are arranged. As a consequence, as compared with the current at the normal spin-transfer torque switching, the current which flows through the tunnel magneto-resistance element TMR can be reduced, so that the memory cell transistor can be made smaller in size and the drive voltage at the writing can be reduced. FIG. 23 is a layout example of a memory cell array according to the second embodiment. The area of the memory cell array is $8F^2$ at the minimum. In the second embodiment, the tunnel magneto-resistance element TMR is shifted and arranged in an extension direction of the word lines with respect to the bottom electrode contact. On the layer lower than the bottom electrode where the tunnel magneto-resistance element TMR formed, writing bit lines are wired in a direction parallel to the bit lines and orthogonal to the word lines. A magnetic field excited with these writing bit lines is used to reduce a current which flows through the tunnel magneto-resistance element required at the writing. Hereinafter, the structure will be explained in detail. FIG. 23 shows an example in which a memory cell is structured using NMOS. On the diffusion layer LN, the source line contact SLC is shared with the adjacent memory cells so that the area is reduced. In an area of the diffusion layer LN where no source line contact SLC of the memory cell transistor is arranged, the bottom electrode contact BEC is arranged. On the bottom electrode contact BEC, the bottom electrode BE in which a tunnel magneto-resistance element TMR is arranged, is formed. In the tunnel magneto-resistance element TMR, as shown in FIGS. 23 through 25, the fixed layer PL is arranged on the side of the bit lines, and the free layer FL is arranged on the side of the NMOS transistor. Consequently, the anti-parallel writing operation which requires a large current can be performed in the source grounding operation having a large current driving power of the transistor. Thus, the area of the memory cell can be made smaller. Furthermore, a voltage required for a writing operation can be decreased, and power consumption can be reduced. The bottom electrode BE is formed in a configuration which extends in direction of the word lines with respect to the bottom electrode contact BEC. The tunnel magneto-resistance element TMR is formed not precisely on the bottom electrode contact BEC but in an area which is swollen in an extension direction of the word lines. On the lower portion of the tunnel magneto-resistance element TMR, the writing bit lines WBL are arranged between the source line contacts of the adjacent memory cells. It is preferable that the distance between the writing bit lines and the bottom electrode is shorten in order to apply a stronger magnetic field by the writing bit lines WBL to the tunnel magneto-resistance element TMR. Note that, whether the writing bit lines WBL extends in a direction parallel to the word lines WL or to the bit lines BL, it is possible to apply a magnetic field to the tunnel magneto-resistance element TMR to assist writing. However, by extending in a direction parallel to the bit lines BL, it becomes unnecessary to avoid a contact, so that the area thereof can be reduced and the layout can be simplified. On an upper portion of the tunnel magneto-resistance element, the bit lines BL are wired. On the source line contact SLC, the source lines are arranged in parallel with the bit lines. Here, although the source lines are wired on a layer upper as compared with the bit lines in FIGS. 24 and 25, the source lines may be wired on a layer in the vicinity of the transistor. In such a case, it becomes unnecessary to wire writing bit lines in a narrow area between the source line contact and the bottom electrode contact BEC as shown in FIG. 25, so that the wiring is simplified.

Figure 26:
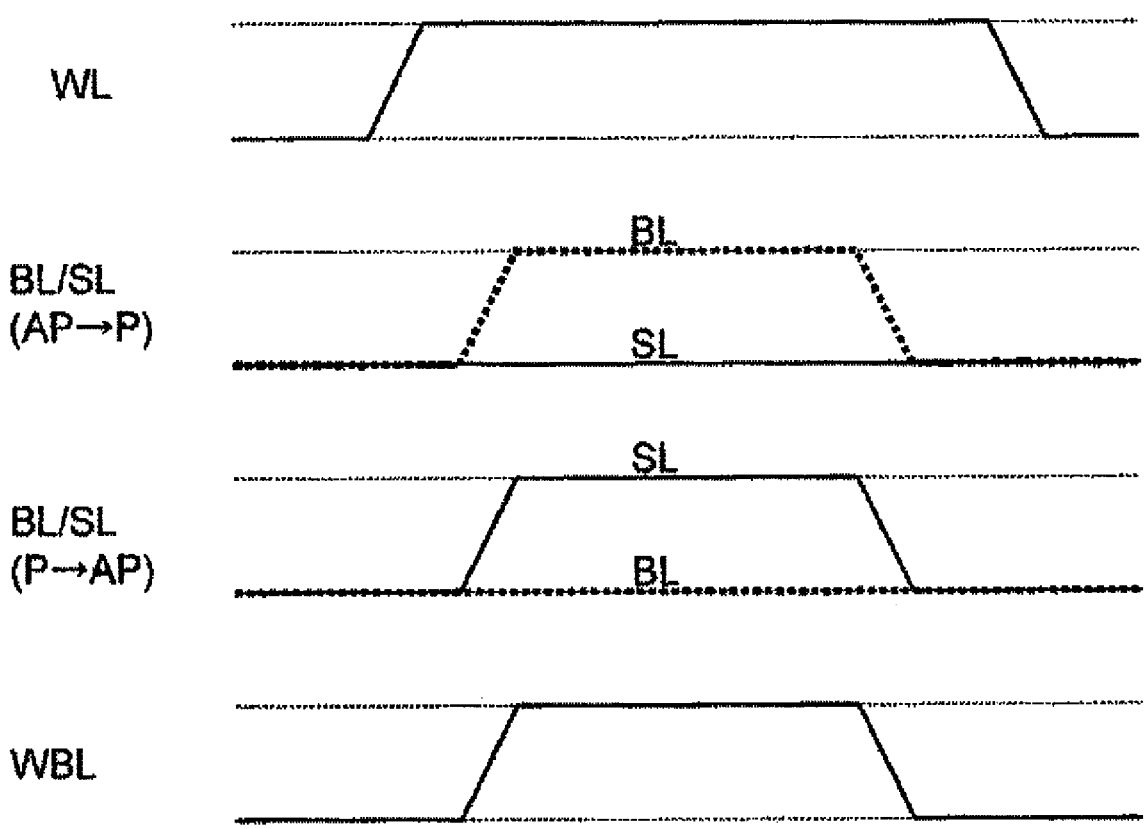
FIG. 26 is an example of writing operation waveform diagram according to the second embodiment.

Next, there will be explained a writing operation by referring to FIG. 26. In the same manner as the aforementioned embodiment, the source lines SL and bit lines BL wired in parallel with each other are driven in a writing operation, and the source lines SL are driven to the bit line driving level VBL and the bit lines BL to a low potential (VSS) in a parallel writing operation. At this time, a current is made to flow through the writing bit lines WBL. The current may be allowed to flow through the writing bit lines WBL in any direction because only an arbitrary magnetic field is required to be applied to the tunnel magneto-resistance element TMR. On the contrary, in an anti-parallel writing operation, the bit lines BL are driven to the bit line driving level (VBL), and the source lines SL to a low potential (VSS). At this time, a current is made to flow through the writing bit lines WBL. The current may be allowed to flow through the writing bit lines WBL in any direction because only an arbitrary magnetic field is required to be applied to the tunnel magneto-resistance element TMR. As a consequence, since a magnetic field is applied from the outside, the current which is made to flow directly through the tunnel magneto-resistance element TMR can be reduced, as a result, the drive current required for the memory cell transistor can be reduced. At the same time as the completion of the writing operation, the drive of the bit lines BL and source lines SL is terminated, furthermore, an application of the current to the writing bit lines WBL is suspended. In a reading operation, because no current is applied to the writing bit lines, the current required for writing become larger, as a result, an erroneous writing by the current at the reading time can be prevented.

Advantages of the present structure are described below. In the same manner as the aforementioned embodiment 1, the anti-parallel writing operation which requires a large current for writing can be performed in the source grounding operation, as a result, the area of the memory cell can be made smaller. Furthermore, by applying a magnetic field excited by the adjacent write bit lines at the writing time, the current made to flow through the tunnel magneto-resistance element TMR at the writing time can be reduced, as a result, the area of the memory cell can be made smaller and the operation voltage can be reduced. Also, by performing the reading operation in the same direction as the anti-parallel writing operation, the reading margin can be improved. And, because no current applied to the writing bit lines, the current required for writing become larger, as a result, the reading margin can be further improved.

Figure 27:
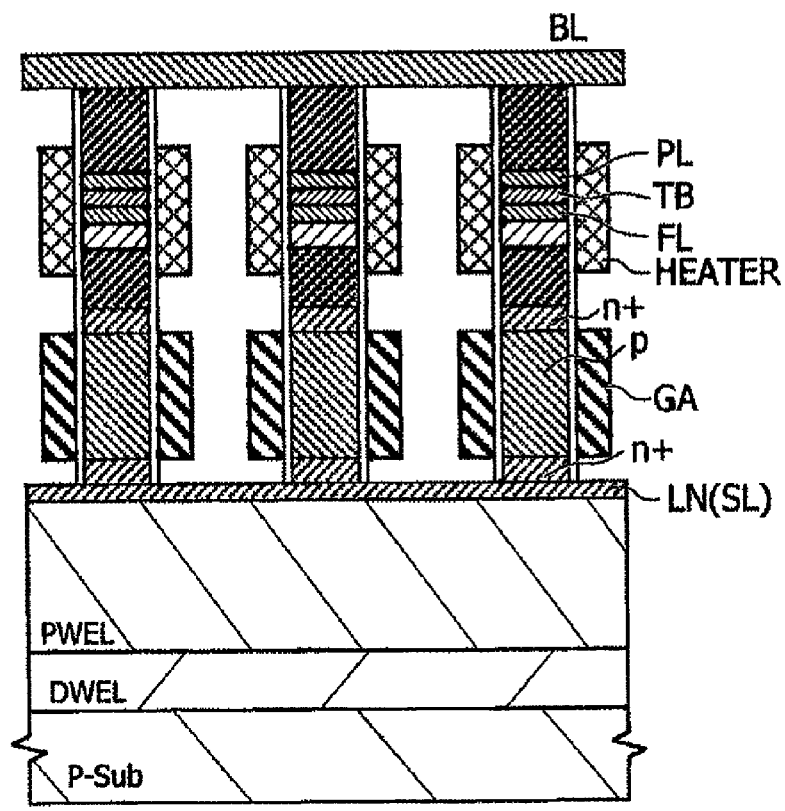
FIG. 27 is sectional views of a memory cell according to a variation of the second embodiment.
Figure 27:
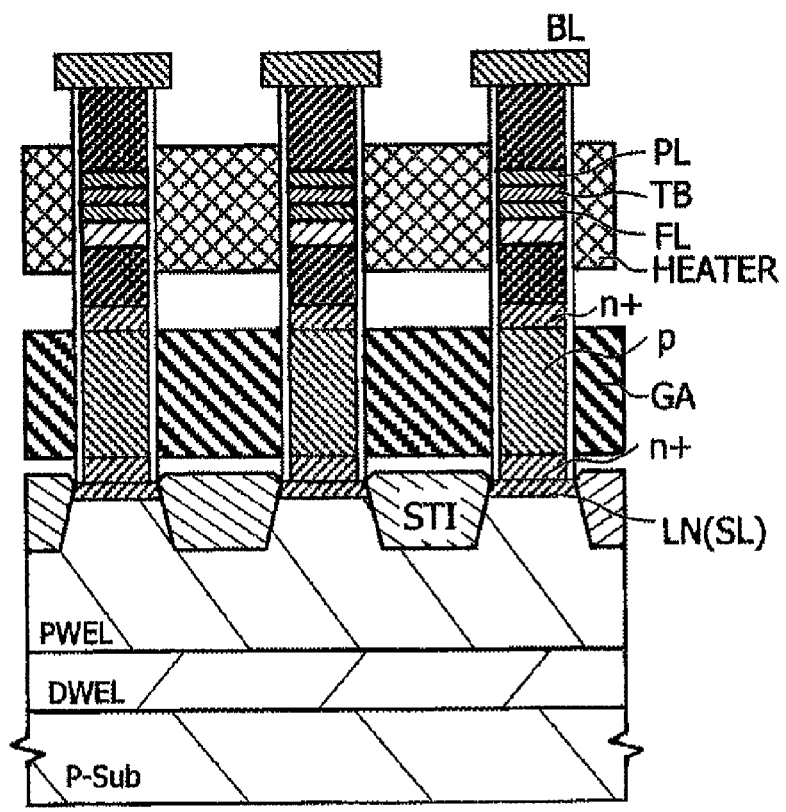

Another variation of the second embodiment is shown in FIG. 27. This structure is characterized in that a heater HEATER is arranged around the tunnel magneto-resistance element TMR. This heater HEATER reduces the current required for writing, by heating the tunnel magneto-resistance element TMR at the writing the spin of the free layer FL of the tunnel magneto-resistance element TMR.

Furthermore, in this embodiment, a memory cell transistor is structured using a vertical type MOS. Consequently, the area of the memory cell can be reduced to $4F^2$.

Details of the structure of the memory cell will be explained by referring to FIG. 27. The memory cell MC comprises a semiconductor junction of $n^+$-p-$n^+$ in a vertical direction with respect to the substrate P-sub. On the periphery of the p-type semiconductor p, a gate electrode GA is arranged and constitutes a vertical type NMOS transistor. The $n^+$ area on the side of the substrate P-sub of the semiconductor junction is connected to the n-type diffusion layer LN in the p-type semiconductor PWEL. This diffusion layer LN constitutes source lines SL. The source lines SL are wired in a direction orthogonal to the gate GA. The $n^+$ area on the opposite side of the source lines SL is connected to the bottom electrode of the tunnel magneto-resistance element TMR. On the bottom electrode, the tunnel magneto-resistance element TMR is arranged. Here, in FIG. 27, the tunnel magneto-resistance element TMR is composed of a free layer FL, a tunnel film TB and a fixed layer PL from the side of the substrate. Furthermore, a heater HEATER which heats at the writing operation time is arranged so as to surround the tunnel magneto-resistance element. The lines of heater HEATER are wired in parallel with the word lines WL (gate GA). On the tunnel magneto-resistance element TMR, the bit lines BL are wired. The bit lines BL are wired in a direction orthogonal to the lines of heater HEATER and the word lines WL (gate GA) and parallel to the source lines SL.

Figure 28:
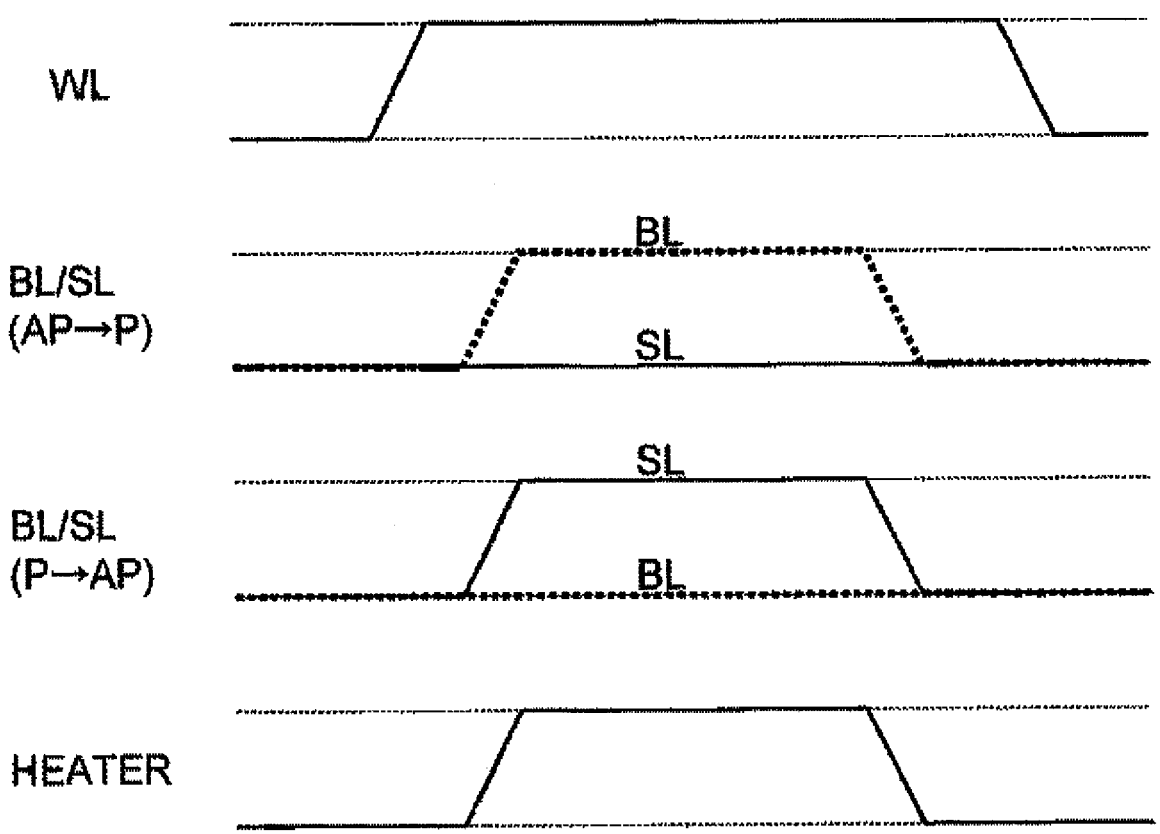
FIG. 28 is a view of operation waveform diagram according to a variation of the second embodiment.
Figure 29A:
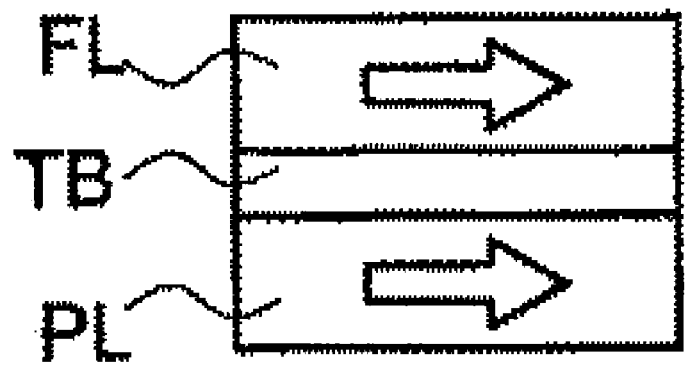
FIG. 29A shows the structure of a tunnel magneto-resistance element.
Figure 29B:
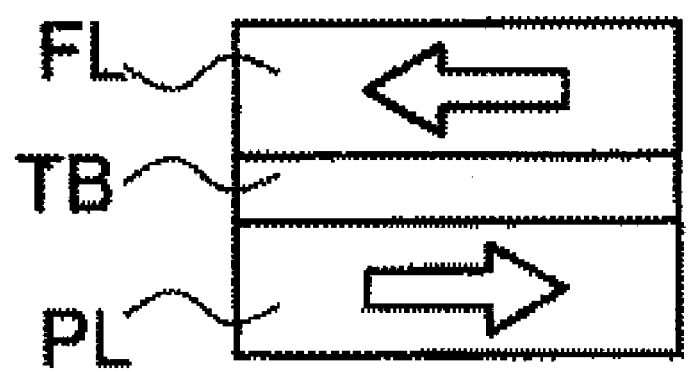
FIG. 29B shows the structure of a tunnel magneto-resistance element.
Figure 30A:
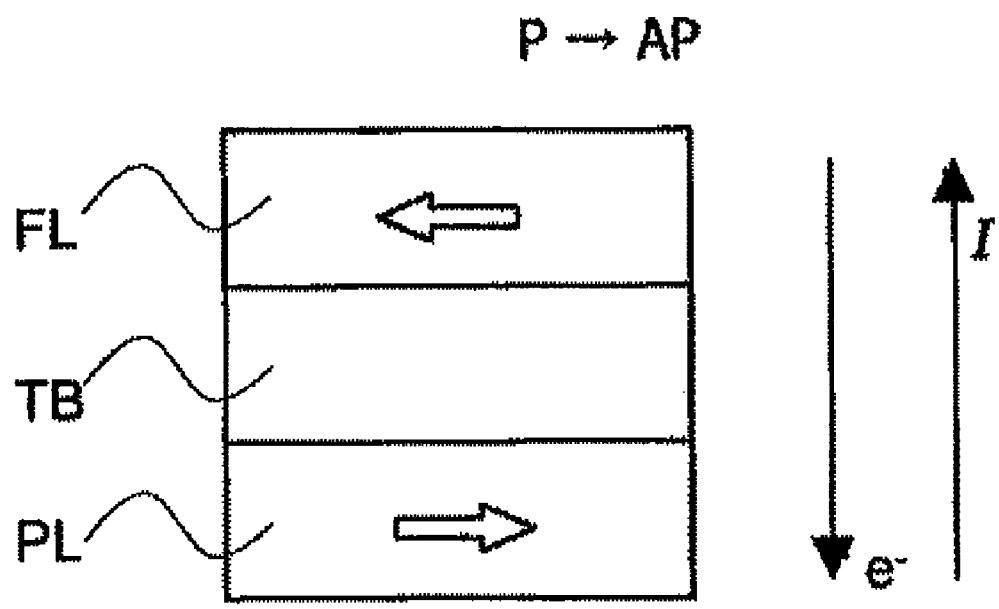
FIG. 30A is a view for illustrating a spin-transfer torque switching of a tunnel magneto-resistance element.
Figure 30B:
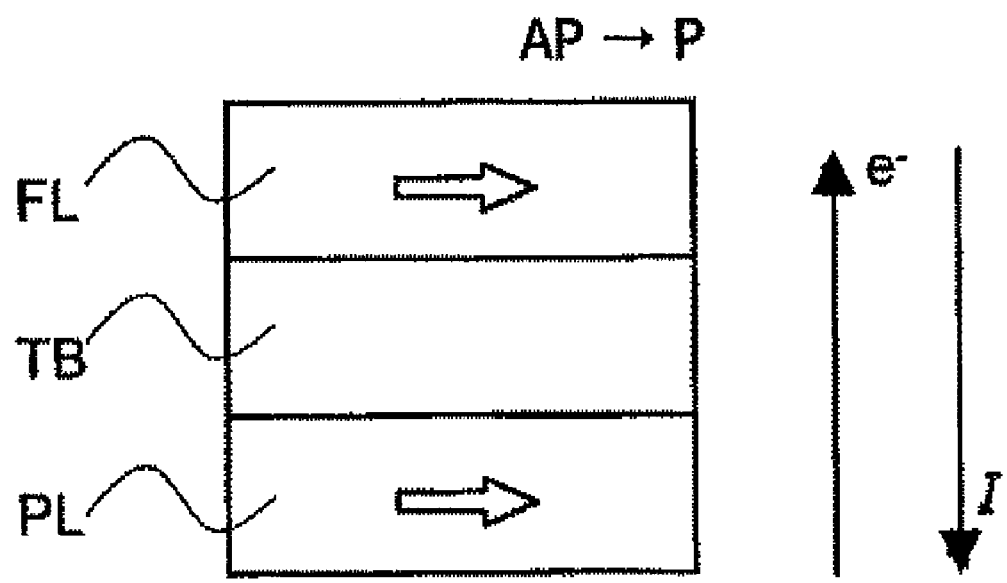
FIG. 30B is a view for illustrating a spin-transfer torque switching of a tunnel magneto-resistance element.
Figure 31:
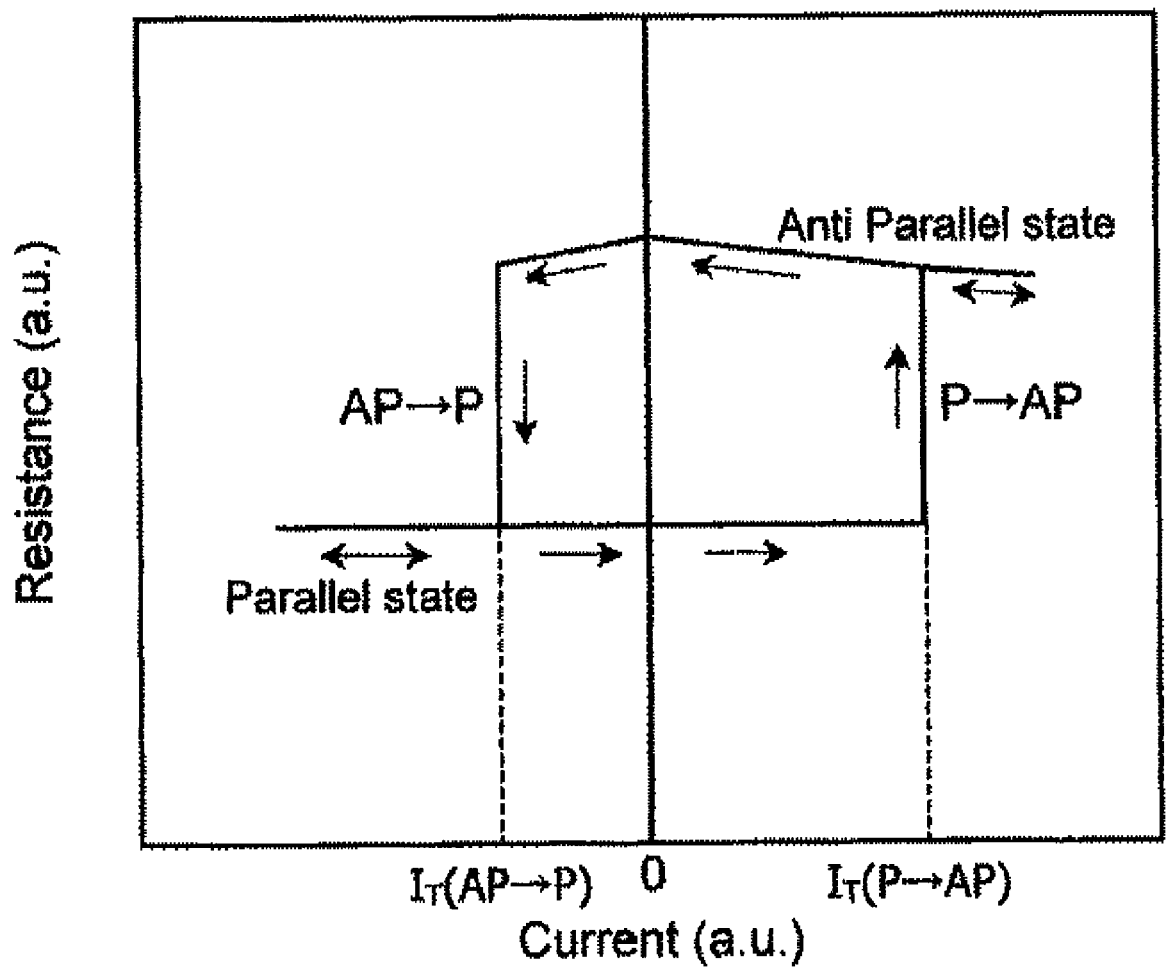
FIG. 31 is a view illustrating a writing property of a tunnel magneto-resistance element.

Next, a writing operation is explained by referring to FIG. 28. In a writing operation, in the same manner as the aforementioned embodiment, the source lines SL and bit lines BL wired in parallel with each other are driven, and in a parallel writing operation, the source lines SL are driven to the bit line driving level VBL and the bit lines BL to a low potential (VSS). At this time, a current is made to flow through the line of heater HEATER, so that the tunnel magneto-resistance element is heated. As a result, the current made to flow directly through the tunnel magneto-resistance element and required for changing the spin direction of the free layer FL of the tunnel magneto-resistance element can be reduced. And, in an anti-parallel writing operation, the bit lines BL are driven to the bit line driving level VBL and the source lines SL are driven to a low potential (VSS). At this time, a current is made to flow through the line of heater HEATER, so that the tunnel magneto-resistance element is heated. As a result, the current made to flow directly through the tunnel magneto-resistance element and required for changing the spin direction of the free layer FL of the tunnel magneto-resistance element can be reduced, and the drive current required for the memory cell transistor can be reduced. At the same time as the completion of the writing operation, the drive of the bit lines BL and source lines SL is terminated, and furthermore, an application of the current to the lines of heater HEATER is suspended. By suspending the application of the current, heat is dissipated and the element is cooled. In a reading operation, because no current is applied to the heater lines, the current required for writing become larger, as a result, erroneous writing can be prevented and the reading speed can be improved even with a larger reading current.

Advantages of the present structure will be explained. In the same manner as the aforementioned embodiment 1 and the variation thereof, the anti-parallel writing operation which requires a large current for writing can be performed in the source grounding operation, as a result, the area of the memory cell can be smaller. Furthermore, by the heating effect of the adjacent heater lines at the writing time, the current which is made to flow through the tunnel magneto-resistance element TMR at the writing time can be decreased, so that the area of the memory cell and the operation voltage can be reduced. And, by performing the reading operation in the same direction as the anti-parallel writing operation, the reading margin can be improved. Furthermore, if heating by means of the heater lines is not performed, the current which requires for writing become larger, as a result, the reading margin can be further improved.

Note that, also in the embodiment 1, it is possible to reduce the area of the memory cell by structuring memory cell transistors using vertical type MOS. In the present embodiment, even if the memory cell transistor using not a vertical type MOS but a normal MOS as described in the embodiment 1 is used, since a heater exists, the heating effect of the adjacent heater lines at the writing can reduce the current made to flow through the tunnel magneto-resistance element TMR at the writing, as a result, the area of the memory cell and the operation voltage can be reduced. And, if heating by means of the heater lines is not performed, the current which requires for writing become larger, as a result, the reading margin can be further improved.

A relation of voltages in the aforementioned embodiments will be described. It is preferable that the reading voltage VR is about 0.5V at which the resistance change rate of the magneto-resistance element is maximized. And, the bit line drive voltage VBL is desirable to be about 1.2V. The word line selection level VWH is preferable to be 1.8V and 2.0V which is higher than the voltage of a peripheral circuit in order to serve a sufficient level of the reading and the writing currents. The voltage VCL of a peripheral circuit is preferable to be about 1.2V.

Furthermore, as for a process node to which the present invention is applied, since the element size of the tunnel magneto-resistance element is desired to be 50 nm×100 nm or less, it is desired that the present invention is applied to a process having a minimum process size (a half of the narrower wiring pitch of the word and bit lines) of 50 nm or newer.

The circuit structure and the cross section structure of the memory cell are not limited to what is described above. Another different structure with the same function or the same cross section will do.

What is claimed is:
1. A semiconductor device comprising:
a plurality of word lines;
a first bit line across the plurality of word lines;
a first source line across the plurality of word lines;

a plurality of first memory cells each having a first transistor and a first tunnel magneto-resistance element, the first transistor and the first tunnel magneto-resistance element being coupled between the first bit line and the first source line in series and a gate of the first transistor being coupled to a corresponding one of the plurality of word lines; and a first equalizer transistor coupled between the first bit line and the first source line, wherein the first equalizer transistor equalizes the first bit line and the first source line when the first bit line and the first source line are not selected.

2. The semiconductor device according to claim 1, wherein the first bit line is supplied with a first potential when the first bit line is not selected, and wherein the first bit line is supplied with a second potential higher than the first potential when the first bit line is selected.

3. The semiconductor device according to claim 1, further comprising:

a pre-charge circuit, wherein the first bit line is supplied with a first potential when the first bit line is not selected, and wherein when the first bit line is selected to read out information from one of the plurality of first memory cells, the pre-charge circuit supplies a second potential higher than the first potential to the first bit line.

4. The semiconductor device according to claim 3, further comprising:

a second bit line across the plurality of word lines;

a second source line across the plurality of word lines;

a plurality of second memory cells each having a second transistor and a second tunnel magneto-resistance element, the second transistor and the second tunnel magneto-resistance element being coupled between the second bit line and the second source line in series and a gate of the second transistor being coupled to a corresponding one of the plurality of word lines;

a column selection circuit coupled to the first bit line, the first source line, the second bit line, and the second source line; and a second equalizer transistor coupled between the second bit line and the second source line, wherein the pre-charge circuit is provided to be common to the first and second bit lines.

5. The semiconductor device according to claim 1, further comprising:

a plurality of bit lines including the first bit line and crossing the plurality of word lines;

a column selection circuit coupled to the plurality of bit lines and selecting one of the plurality of bit lines; and a pre-charge circuit coupled to the column selection circuit and provided to be common to the plurality of bit lines, wherein the plurality of bit lines are supplied with a first potential in a non-selected state, and wherein when one of the plurality of bit lines is selected to read out information, the pre-charge circuit supplies a second potential higher than the first potential to the column selection circuit and the column selection circuit supplies the second potential to the selected one of the plurality of bit lines.

* * * * *